(12) United States Patent
Lee et al.

(10) Patent No.: US 12,490,504 B2
(45) Date of Patent: Dec. 2, 2025

(54) HIGH DENSITY LINEAR CAPACITOR IN SEMICONDUCTOR TECHNOLOGIES

(71) Applicant: QUALCOMM Incorporated, San Diego, CA (US)

(72) Inventors: Bruce Lee, Irvine, CA (US); Chandra Satya Priyanka Tirupathi, Bangalore (IN); Liang Dai, San Diego, CA (US); Dinesh Jagannath Alladi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 464 days.

(21) Appl. No.: 17/650,233

(22) Filed: Feb. 7, 2022

(65) Prior Publication Data

US 2023/0253400 A1 Aug. 10, 2023

(51) Int. Cl.
*H10D 84/80* (2025.01)
*H01L 23/522* (2006.01)
*H10D 1/68* (2025.01)
*H10D 84/00* (2025.01)

(52) U.S. Cl.
CPC ....... *H10D 84/813* (2025.01); *H01L 23/5223* (2013.01); *H10D 1/714* (2025.01); *H10D 84/212* (2025.01); *H10D 1/692* (2025.01)

(58) Field of Classification Search
CPC ............. H01L 27/0733; H01L 27/0805; H01L 23/5223; H01L 28/86; H01L 23/528; H01L 23/5283; H10D 84/813; H10D 1/692; H10D 1/714
See application file for complete search history.

(56) References Cited

U.S. PATENT DOCUMENTS

| 8,890,288 | B2 | 11/2014 | Chen et al. |
| 9,306,570 | B1 * | 4/2016 | Sahu ............... H03K 19/017581 |
| 10,096,522 | B2 | 10/2018 | Yang et al. |
| 10,269,490 | B2 | 4/2019 | Wang et al. |

(Continued)

OTHER PUBLICATIONS

International Search Report and Written Opinion—PCT/US2023/011020—ISA/EPO—Jun. 15, 2023.

*Primary Examiner* — Aaron J Gray
(74) *Attorney, Agent, or Firm* — Procopio, Cory, Hargreaves & Savitch LLP

(57) ABSTRACT

A device includes a first plurality of MEOL interconnects coupled to a second node that extends in a first direction. The first plurality of MEOL interconnects includes first and second subsets of MEOL second-terminal interconnects. The device includes a second plurality of MEOL interconnects coupled to a first node that extends in the first direction. The second plurality of MEOL interconnects includes first and second subsets of MEOL first-terminal interconnects. The first subsets of MEOL first-terminal and second-terminal interconnects are interleaved and are a first subset of interleaved MEOL interconnects. The second subsets of MEOL first-terminal and second-terminal interconnects are interleaved and are a second subset of interleaved MEOL interconnects. The device includes at least one of a first plurality of gate interconnects or a first plurality of OD regions extending in a second direction orthogonal to the first direction between the first and second subsets of interleaved MEOL interconnects.

30 Claims, 17 Drawing Sheets

(56) References Cited

U.S. PATENT DOCUMENTS

| | | | |
|---|---|---|---|
| 10,453,791 B2 | 10/2019 | Fu et al. | |
| 2013/0087886 A1 | 4/2013 | Chen et al. | |
| 2013/0200489 A1* | 8/2013 | Huang | H10D 1/692 |
| | | | 257/532 |
| 2015/0137201 A1 | 5/2015 | Lee et al. | |
| 2015/0249081 A1* | 9/2015 | Chun | H10D 84/811 |
| | | | 257/300 |
| 2019/0371725 A1* | 12/2019 | Cheng | H01L 23/66 |

* cited by examiner

HIGH DENSITY LINEAR CAPACITOR IN SEMICONDUCTOR TECHNOLOGIES

TECHNICAL FIELD

The present disclosure relates generally to a layout structure, and more particularly, to a high density linear capacitor in semiconductor technologies.

INTRODUCTION

A typical integrated circuit (IC) includes a stack of sequentially formed layers. Each layer may be stacked or overlaid on a prior layer and patterned to form the shapes that define transistors (e.g., field effect transistors (FETs), fin FETs (FinFETs), gate-all-around (GAA) FETs (GAAFETs), and/or other multigate FETs) and connect the transistors into circuits. Devices may be arranged based on a particular layout structure. There is currently a need for improved and higher density linear capacitors.

BRIEF SUMMARY

In an aspect of the disclosure, a device includes a first plurality of middle-end-of-line (MEOL) interconnects coupled to a second node and extending in a first direction across at least a portion of the device. The first plurality of MEOL interconnects includes at least a first subset of MEOL second-terminal interconnects and a second subset of MEOL second-terminal interconnects. The device further includes a second plurality of MEOL interconnects coupled to a first node and extending in the first direction across at least a portion of the device. The second plurality of MEOL interconnects includes at least a first subset of MEOL first-terminal interconnects and a second subset of MEOL first-terminal interconnects. The first subset of MEOL second-terminal interconnects and the first subset of MEOL first-terminal interconnects are interleaved and are a first subset of interleaved MEOL interconnects. The second subset of MEOL second-terminal interconnects and the second subset of MEOL first-terminal interconnects are interleaved and are a second subset of interleaved MEOL interconnects. The device further includes at least one of a first plurality of gate interconnects or a first plurality of oxide diffusion (OD) regions extending in a second direction between the first subset of interleaved MEOL interconnects and the second subset of interleaved MEOL interconnects. The second direction is orthogonal to the first direction.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Figure 1:
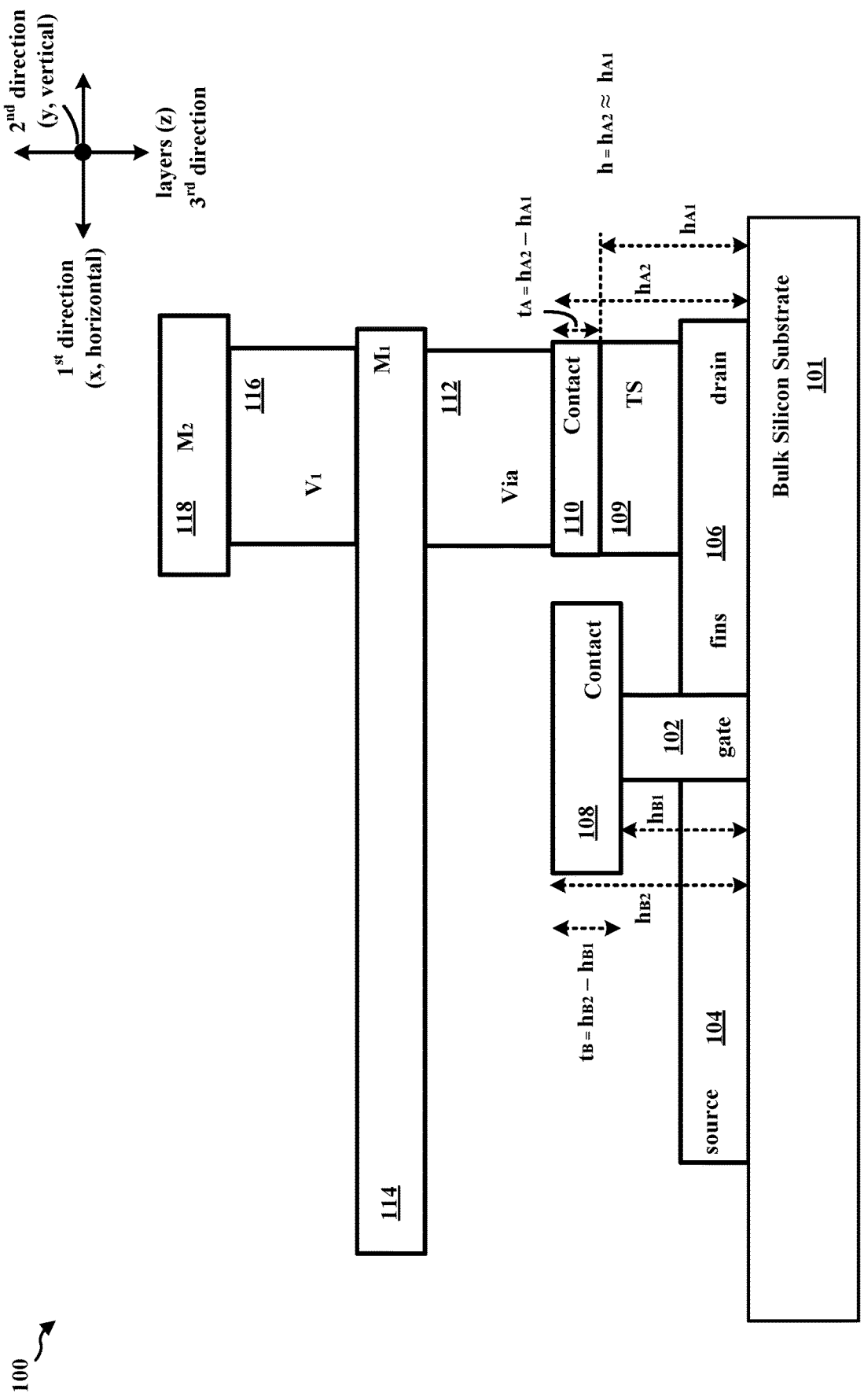
FIG. 1 is a first diagram illustrating a side view of various layers within an IC.

FIG. 1 is a first diagram 100 illustrating a side view of various layers within a cell device and IC. The various layers change in the z direction (labeled as the $3^{rd}$ direction). As illustrated in FIG. 1, a transistor has a gate 102 (which may be referred to as POLY in some instances even though the gate may be formed of metal, polysilicon, or a combination of polysilicon and metal), a source 104, and a drain 106. The gate 102 is formed by a gate interconnect. The source 104 and the drain 106 may be formed by fins 104, 106 on the bulk silicon substrate 101. The bulk silicon substrate 101 may be referred to as a wafer or a slice. The bulk silicon substrate 101 may be formed with a very small amount of specific impurities (e.g., 0.0001% of boron, phosphorus, arsenic, antimony, or the like) added to the melt, which defines the bulk silicon substrate 101 (which, based on the above impurities, may be around 99.9999% silicon) as either bulk p-type (also referred to as p-type substrate or P-substrate) or bulk n-type (also referred to as n-type substrate or N-substrate). The gate 102 may extend in a second direction (e.g., vertical direction along the y axis coming out of the page), and the fins 104, 106 may extend in a first direction orthogonal to the second direction (e.g., horizontal direction along the x axis). A contact layer interconnect 108 (also referred to as a metal POLY (MP) layer interconnect, contact B (CB) layer interconnect, or middle-end-of-line (MEOL) interconnect) may contact the gate 102. A trench silicide (TS) layer 109 may contact the source 104 and/or the drain 106. A contact layer interconnect 110 (also referred to as a metal diffusion (MD) layer interconnect, contact A (CA) layer interconnect, or MEOL interconnect) may contact the TS layer 109. Top portions of the contact layer interconnects 110, 108 are at a height from the bulk silicon substrate 101 of $h_{A2}$, $h_{B2}$, respectively, and bottom portions of the contact layer interconnects 110, 108 are at a height from the bulk silicon substrate 101 of $h_{A1}$, $h_{B1}$, respectively. Accordingly, the contact layer interconnect 110 has a thickness in the z direction of $t_A = h_{A2} - h_{A1}$, and the contact layer interconnect 108 has a thickness in the z direction of $t_B = h_{B2} - h_{B1}$. In one configuration, $h_{A2} \approx h_{B2}$ (both of which are denoted as being equal to h). As the gate 102 has a lower height $h_{B1}$ than the height $h_{A1}$ of the TS layer 109, the thickness $t_B$ of the contact layer interconnect 108 is greater than the thickness $t_A$ of the contact layer interconnect 110. A via 112 (also referred to as via A (VA)) may contact the contact layer interconnect 110. A metal 1 ($M_1$) layer interconnect 114 may contact the via 112. The $M_1$ layer interconnect 114 is illustrated as extending in the first direction, but may also extend in the second direction. A via $V_1$ 116 may contact the $M_1$ layer interconnect 114. A metal 2 ($M_2$) layer interconnect 118 may contact the via $V_1$ 116. The $M_2$ layer interconnect 118 is illustrated as extending in the second direction, but may alternatively extend in the first direction. Higher layers include a via layer including vias $V_2$, a metal 3 ($M_3$) layer including $M_3$ layer interconnects, and higher via/metal layers. The $M_3$ layer and higher layer interconnects may extend in the first direction or the second direction. Metal layers at a metal q ($M_q$) layer and above may extend in both the first and second directions. A cell device may be implemented with FinFETs (as illustrated), GAAFETs, or other multigate FETs. For a continuous OD region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Figure 2:
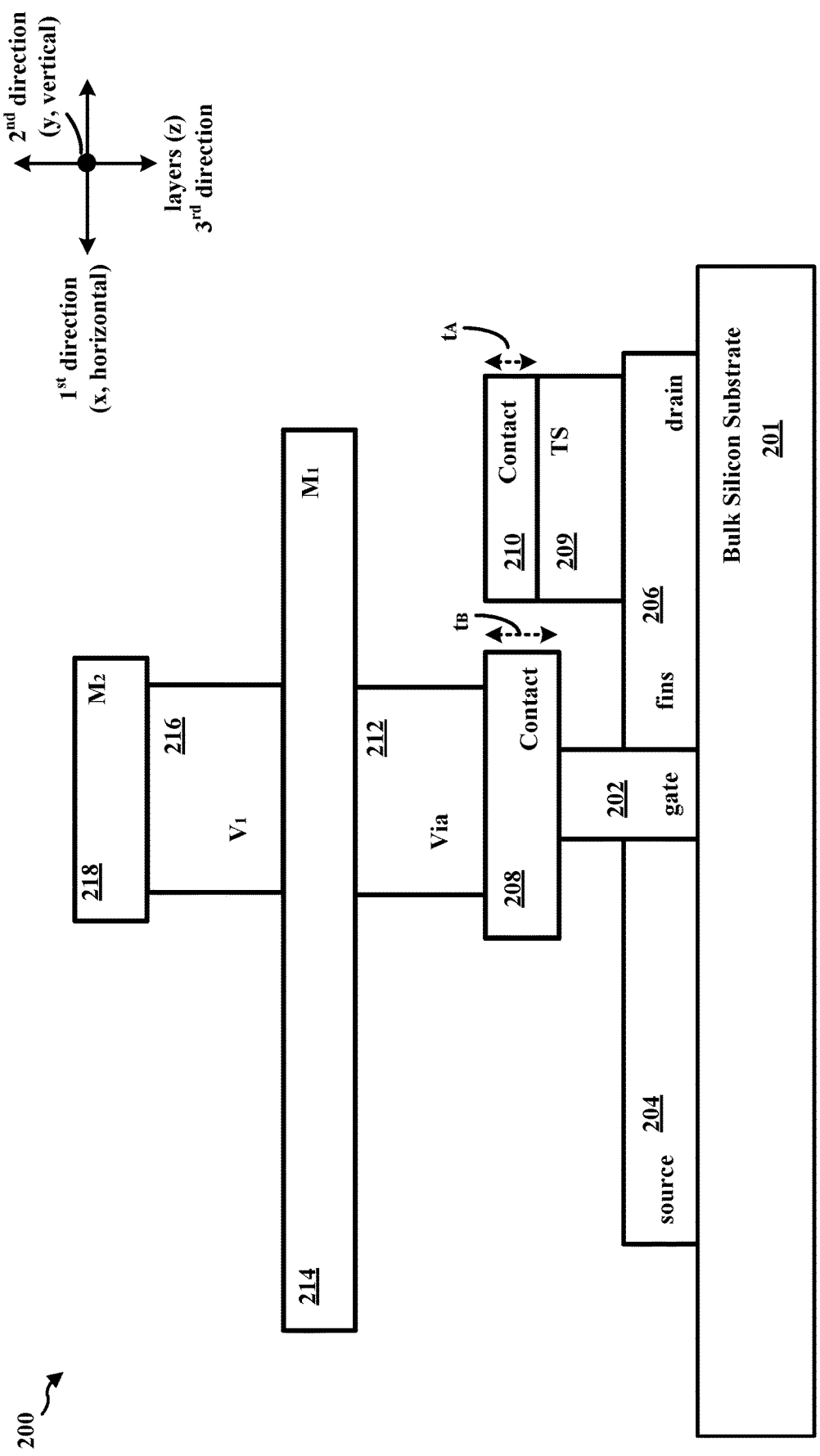
FIG. 2 is a second diagram illustrating a side view of various layers within an IC.

FIG. 2 is a second diagram 200 illustrating a side view of various layers within a standard cell and IC. The various layers change in the z direction (labeled as the $3^{rd}$ direction). As illustrated in FIG. 2, a transistor has a gate 202, a source 204, and a drain 206. The gate 202 is formed by a gate interconnect. The source 204 and the drain 206 may be formed by fins 204, 206 on the bulk silicon substrate 201. The bulk silicon substrate 201 may be referred to as a wafer or a slice. The bulk silicon substrate 201 may be formed with a very small amount of specific impurities (e.g., 0.0001% of boron, phosphorus, arsenic, antimony, or the like) added to the melt, which defines the bulk silicon substrate 201 (which, based on the above impurities, may be around 99.9999% silicon) as either bulk p-type (also referred to as p-type substrate or P-substrate) or bulk n-type (also referred to as n-type substrate or N-substrate). The gate 202 may extend in a second direction (e.g., vertical direction along the y axis coming out of the page), and the fins 204, 206 may extend in a first direction orthogonal to the second direction (e.g., horizontal direction along the x axis). A contact layer interconnect 208 (also referred to as MP layer interconnect or CB layer interconnect) may contact the gate 202. A TS layer 209 may contact the source 204 and/or the drain 206. A contact layer interconnect 210 (also referred to as an MD layer interconnect, CA layer interconnect, or MEOL interconnect) may contact the TS layer 209. As discussed above, the thickness $t_B$ of the contact layer interconnect 208 is greater than the thickness to of the contact layer interconnect 210. A via 212 (also referred to as via B (VB)) may contact the contact layer interconnect 208. An $M_1$ layer interconnect 214 may contact the via 212. The $M_1$ layer interconnect 214 is illustrated as extending in the first direction, but may also extend in the second direction. A via $V_1$ 216 may contact the $M_1$ layer interconnect 214. An $M_2$ layer interconnect 218 may contact the via $V_1$ 216. The $M_2$ layer interconnect 218 is illustrated as extending in the second direction, but may alternatively extend in the first direction. Higher layers include a via layer including vias $V_2$, an $M_3$ layer including $M_3$ layer interconnects, and higher via/metal layers. The $M_3$ layer and higher layer interconnects may extend in the first direction or the second direction. Metal layers at an $M_q$ layer and above may extend in both the first and second directions. A cell device may be implemented with FinFETs (as illustrated), GAAFETs, or other multigate FETs. For a continuous OD region across multiple devices, the fins are continuous (in the first direction) across the multiple devices. For a discontinuous OD region across multiple devices, the fins are separate at a diffusion break (e.g., single/double diffusion break extending in the second direction) between different sets of the multiple devices.

Referring again to FIGS. 1, 2, the transistor including the gate 102, 202, drain 106, 206, and source 104, 204 is on front-end-of-line (FEOL) layers. The contact layer interconnects 108, 208 and the contact layer interconnects 110, 210 are on MEOL layers. Metal layers including the $M_1$ layer 114, 214 and higher metal layers (e.g., $M_2$ layer 118, 218) are on back-end-of-line (BEOL) layers.

There are many analog circuits where linear capacitors are needed for signal processing or for circuit compensation. For example, linear capacitors may be used as Miller compensation capacitors in a feedback circuit, such as a low-dropout regulator (LDO) or an amplifier. For another example, linear capacitors may be used in switched capacitor circuits such as an analog to digital converter (ADC). Linear capacitors refer to capacitors whose capacitance is independent of the voltage across its terminals. Linearity is critical in many analog applications. Given the high wafer costs of FinFET technologies, high density capacitors are desirable to reduce the integrated circuit (IC) chip area. Metal oxide semiconductor (MOS) capacitors have high density, but are highly nonlinear, and consequently not suitable as a signal path capacitor. Existing metal capacitors with inter-digitated fingers are linear, but have low density.

As discussed below in relation to FIGS. 3-17, different configurations of capacitors are provided that have a higher density than existing metal-oxide-metal (MOM) capacitors. The provided capacitors have a top terminal (also referred to as top plate) and a bottom terminal (also referred to as bottom plate), where a portion of the top and bottom terminals are on MEOL layers and MEOL interconnects of the top and bottom terminals are interleaved. The portion of the top and bottom terminals that are on MEOL layers may be referred to as a MEOL capacitor. As discussed above, the MEOL layers include the contact layer interconnects 108, 208 and the contact layer interconnects 110, 210. The contact layer interconnects 108, 208 may be referred to as CB/MP layer interconnects, or generally as MEOL interconnects. The contact layer interconnects 110, 210 may be referred to as CA/MD layer interconnects, or generally as MEOL interconnects. Herein, the contact layer interconnects 110, 210 will be referred to as type A MEOL interconnects, and the contact layer interconnects 108, 208 will be referred to as type B MEOL interconnects. As discussed in relation to FIGS. 3-17, the MEOL capacitor may be formed with interleaved type B MEOL interconnects, and may further include type A MEOL interconnects that tie top/bottom terminal subsets of type B MEOL interconnects together.

Figure 3:
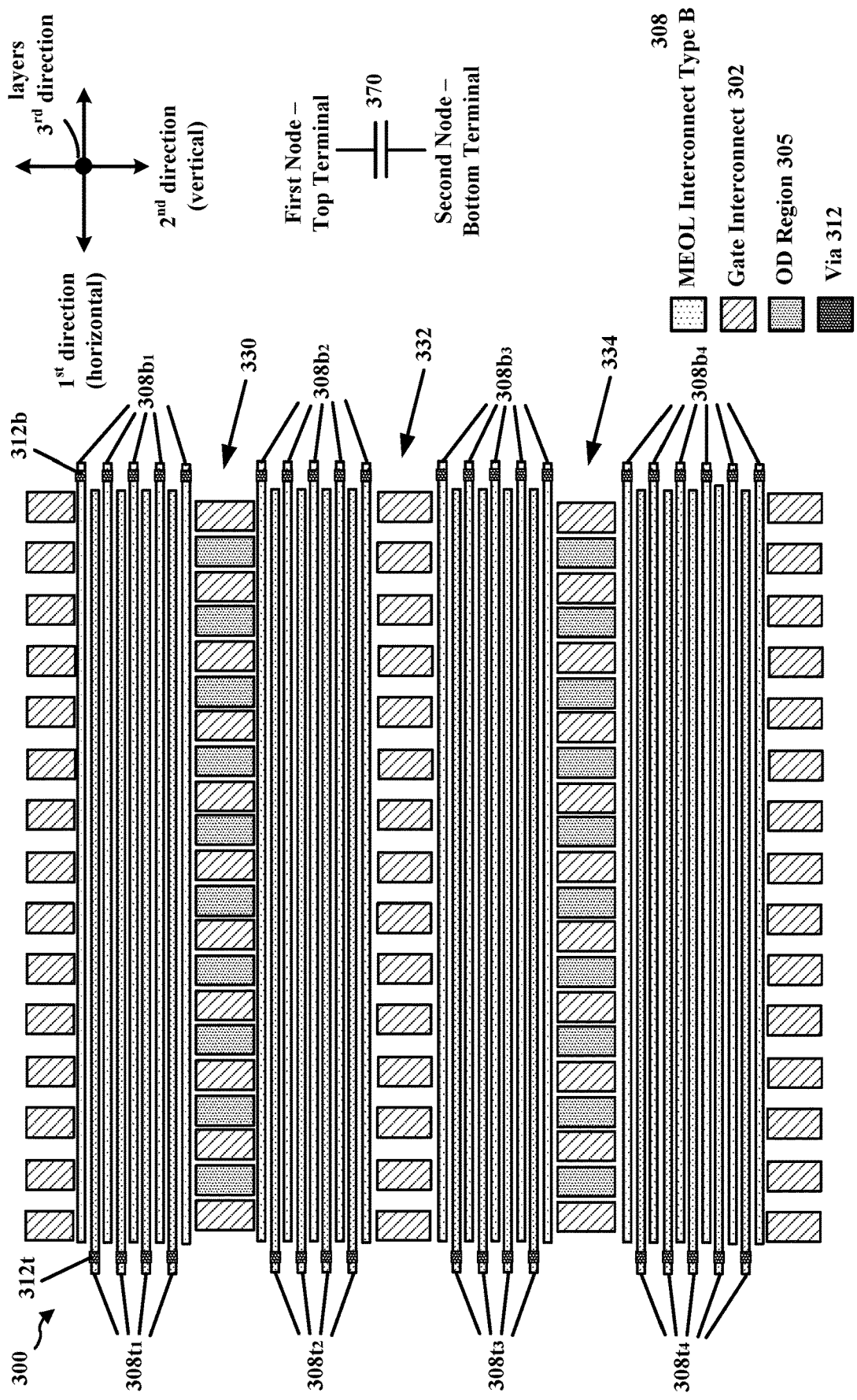
FIG. 3 is a diagram conceptually illustrating a top view of a portion of a high density linear capacitor based on a first configuration.

FIG. 3 is a diagram 300 conceptually illustrating a top view of a portion of a high density linear capacitor based on a first configuration. As illustrated in FIG. 3, sets of MEOL interconnects $308t_1$, $308t_2$, $308t_3$, $308t_4$ extend in a first direction across at least a portion of the device. The sets of MEOL interconnects $308t_1$, $308t_2$, $308t_3$, $308t_4$ are coupled to a first node through vias $312t$. In one example, the first node is the top terminal of the capacitor 370. In addition, sets of MEOL interconnects $308b_1$, $308b_2$, $308b_3$, $308b_4$ extend in the first direction across at least a portion of the device. The sets of MEOL interconnects $308b_1$, $308b_2$, $308b_3$, $308b_4$ are coupled to a second node through vias $312b$. The vias $312t$, $312b$ are identified as 312 in the pattern key. In one example, the second node is the bottom terminal of the capacitor 370. The sets of MEOL interconnects $308t_1$, $308b_1$, the sets of MEOL interconnects $308t_2$, $308b_2$, the sets of MEOL interconnects $308t_3$, $308b_3$, and the sets of MEOL interconnects $308t_4$, $308b_4$ are each interleaved in the first direction. Between the sets of MEOL interconnects $308t_1$, $308b_1$ and the sets of MEOL interconnects $308t_2$, $308b_2$, a plurality of gate interconnects 302 (which may be referred to as POLY contacts (PC)) and a plurality of OD regions 305 (which may be referred to as active RX regions) at 330 may extend in a second direction orthogonal to the first direction. The plurality of gate interconnects 302 and the plurality of OD regions 305 at 330 may be interleaved. In addition, between the sets of MEOL interconnects $308t_2$, $308b_2$ and the sets of MEOL interconnects $308t_3$, $308b_3$, a plurality of gate interconnects 302 at 332 may extend in the second direction. Alternatively, between the sets of MEOL interconnects $308t_2$, $308b_2$ and the sets of MEOL interconnects $308t_3$, $308b_3$, a plurality of OD regions 305 at 332 may extend in the second direction. Further, between the sets of MEOL interconnects $308t_3$, $308b_3$ and the sets of MEOL interconnects $308t_4$, $308b_4$, a plurality of gate interconnects 302 and a plurality of OD regions 305 at 334 may extend in the second direction. The plurality of gate interconnects 302 and the plurality of OD regions 305 at 334 may be interleaved. The plurality of gate interconnects 302 at 330, 332, 334 and the plurality of OD regions 305 at 330, 334 may be floating and not tied to any node or voltage. The plurality of gate interconnects 302 at 330, 332, 334 and the plurality of OD regions 305 at 330, 334 may be used as fills to meet PC/RX density requirements. Without PC/RX density requirements, additional MEOL interconnects may be utilized at regions 330, 332, 334 to increase the effective capacitance of the sets of interleaved MEOL interconnects $308t_1$, $308t_2$, $308t_3$, $308t_4$, $308b_1$, $308b_2$, $308b_3$, $308b_4$ (identified as 308 in the pattern key).

Figure 8:
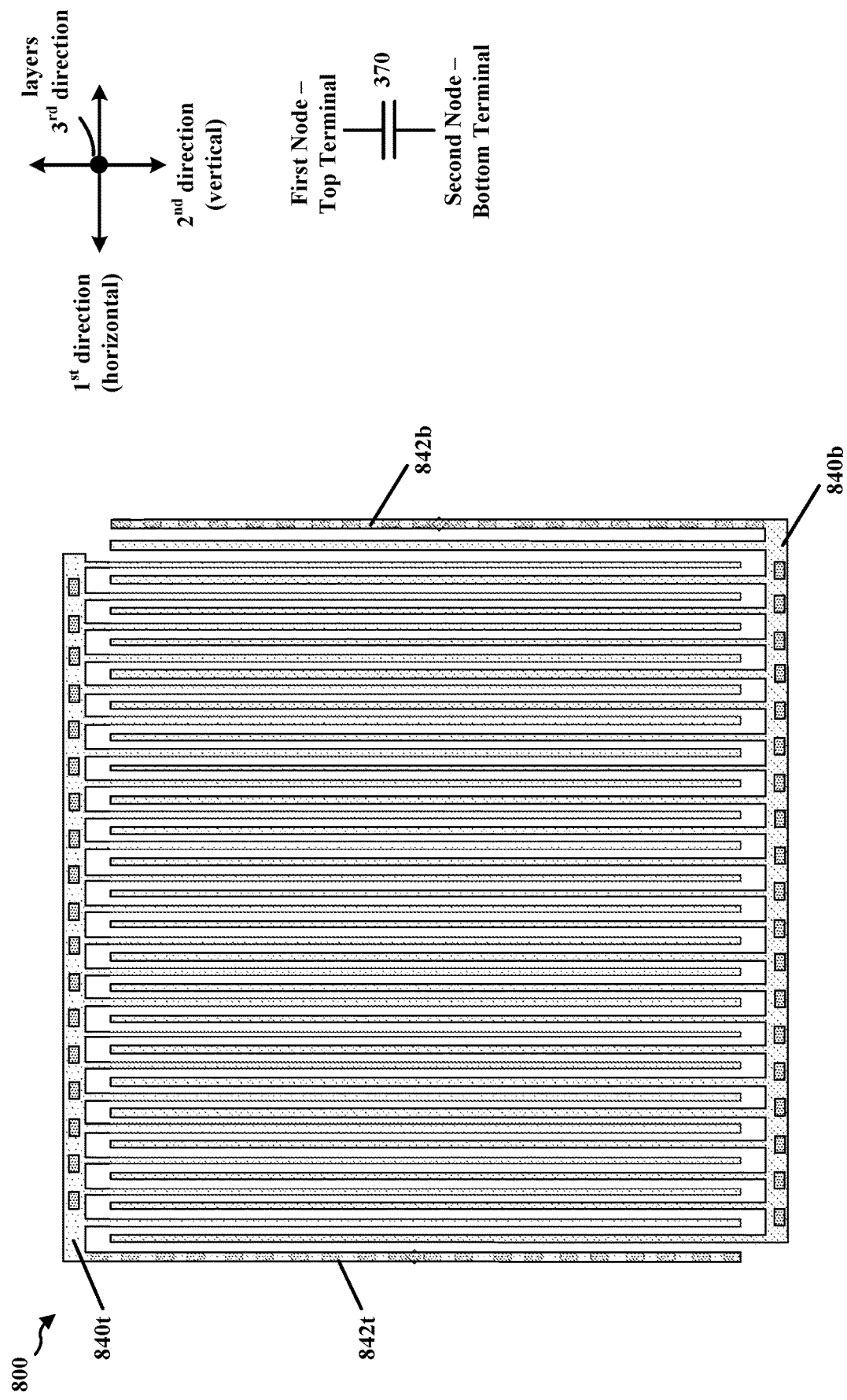
FIG. 8 is a diagram conceptually illustrating a top view of an upper portion of a high density linear capacitor based on a first configuration.

The sets of MEOL interconnects $308t_1$, $308t_2$, $308t_3$, $308t_4$ are configured to be at least a portion of the first terminal of the capacitor 370, and the sets of MEOL interconnects $308b_1$, $308b_2$, $308b_3$, $308b_4$ are configured to be at least a portion of the second terminal of the capacitor 370. The additional portion of the capacitor 370 is illustrated in FIG. 8. In one configuration, each MEOL interconnect 308 of the sets of MEOL interconnects $308t_1$, $308t_2$, $308t_3$, $308t_4$ and the sets of MEOL interconnects $308b_1$, $308b_2$, $308b_3$, $308b_4$ is a type B MEOL interconnect, which as discussed above, may be an MP/CB contact layer interconnect 108, 208.

Figure 4:
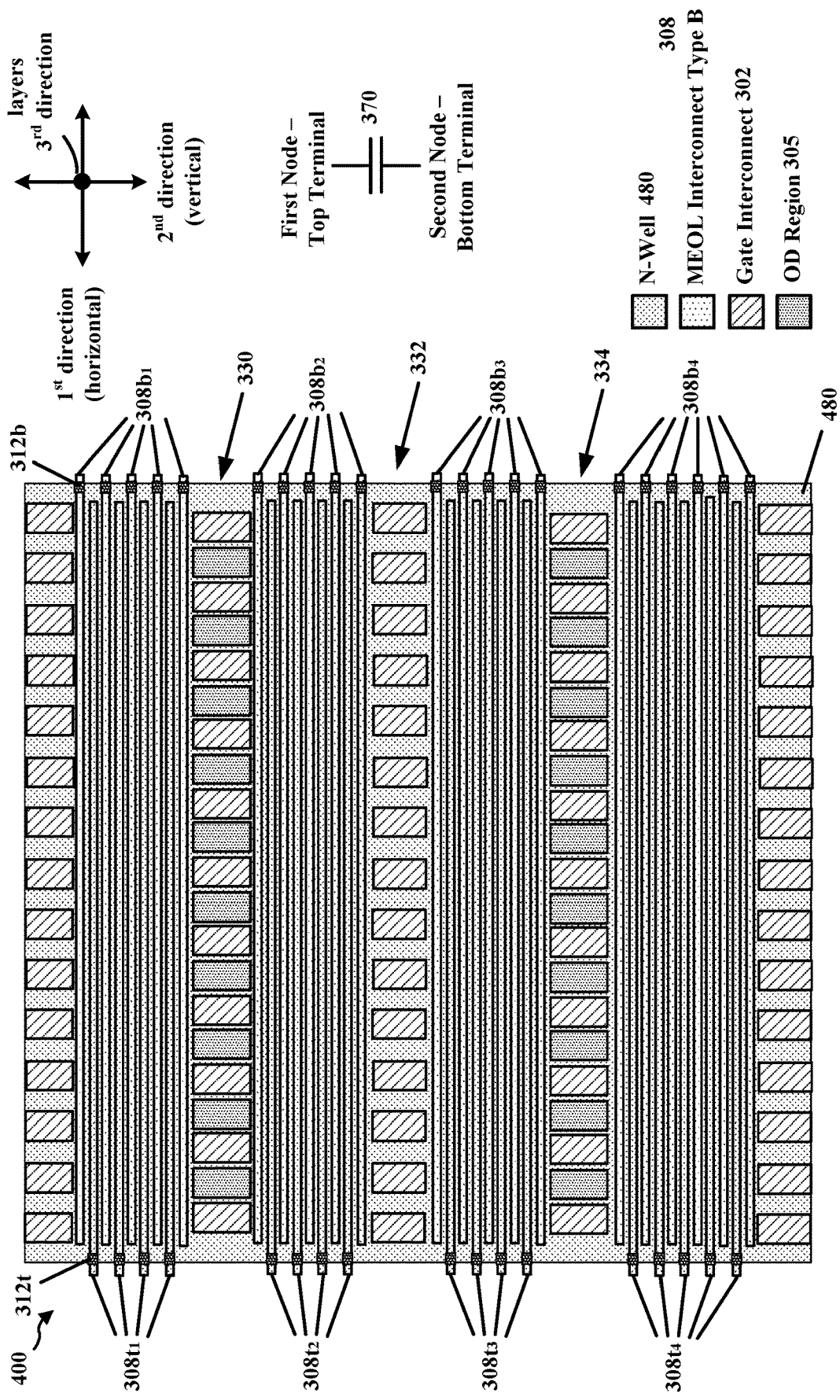
FIG. 4 is a diagram conceptually illustrating a top view of a portion of a high density linear capacitor based on a second configuration.

FIG. 4 is a diagram 400 conceptually illustrating a top view of a portion of a high density linear capacitor based on a second configuration. As illustrated in FIG. 4, the device illustrated in FIG. 3 may include an n-type well (n-well) 480 that extends across the device, where the n-well 480 is below the sets of interleaved MEOL interconnects $308t_1$, $308t_2$, $308t_3$, $308t_4$, $308b_1$, $308b_2$, $308b_3$, $308b_4$. In a first configuration, the sets of MEOL interconnects $308b_1$, $308b_2$, $308b_3$, $308b_4$ are coupled to the n-well 480. In such a configuration, the first node (top terminal of the capacitor 370) is shielded from the substrate. Shielding the first node (top terminal) from the substrate through tying the second node (bottom terminal) to the n-well reduces parasitic capacitances on the first node (e.g., from 4% to 0.6% of the total capacitance). However, in such a configuration, the second node (bottom terminal) will have a greater parasitic capacitance (e.g., increasing from 4.5% to 20%-22% of the total capacitance) that is non-linear and will require a larger drive strength through a signal path including the capacitor 370. In a second configuration, a third node is coupled to the n-well 480, where the third node is unconnected to the first node (top terminal of the capacitor 370) and the second node (bottom terminal of the capacitor 370).

Figure 5:
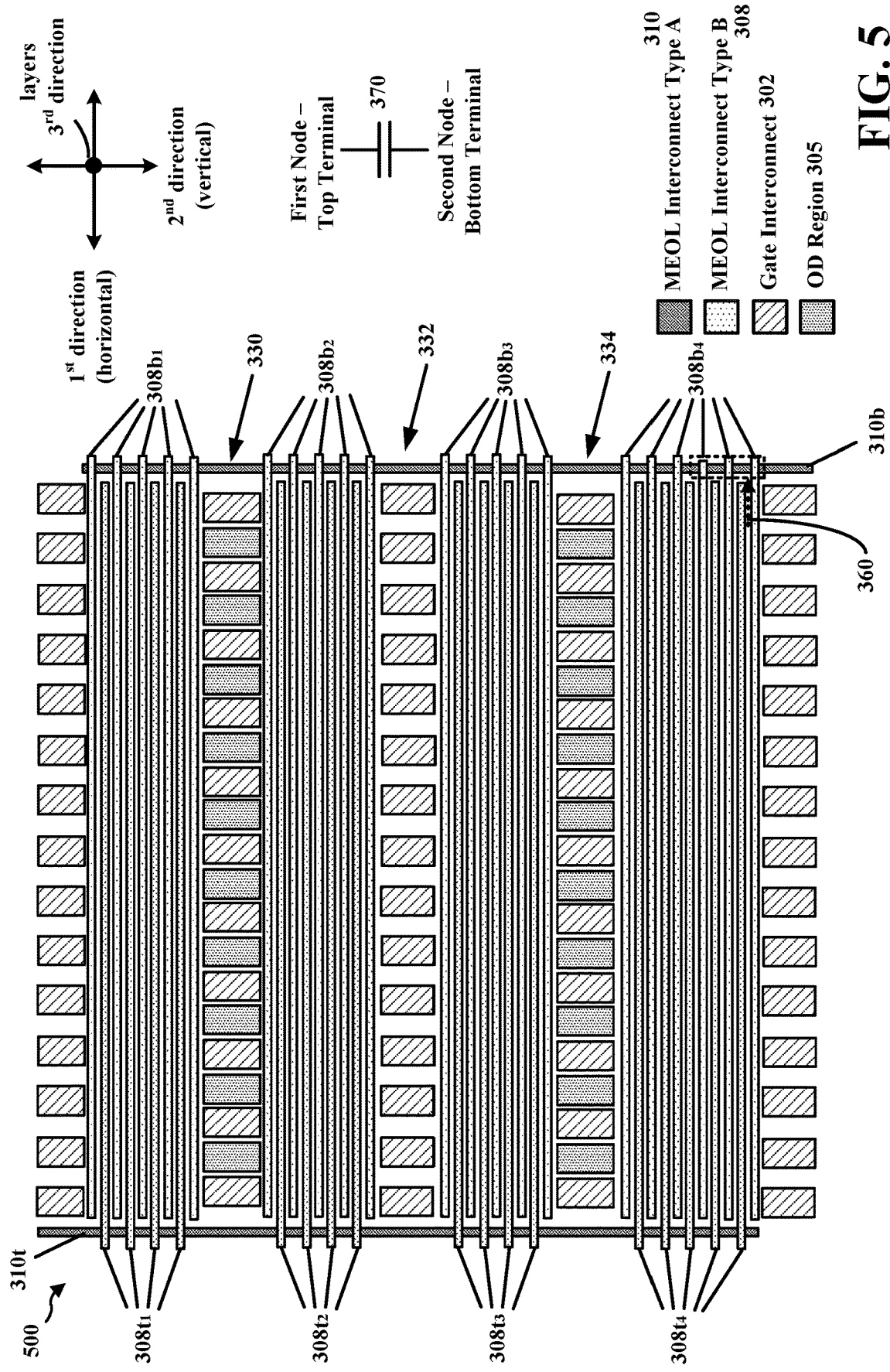
FIG. 5 is a diagram conceptually illustrating a top view of a portion of a high density linear capacitor based on a third configuration.

FIG. 5 is a diagram 500 conceptually illustrating a top view of a portion of a high density linear capacitor based on a third configuration. As illustrated in FIG. 5, sets of MEOL interconnects $308t_1$, $308t_2$, $308t_3$, $308t_4$ extend in a first direction across at least a portion of the device. The sets of MEOL interconnects $308t_1$, $308t_2$, $308t_3$, $308t_4$ are coupled together by the MEOL interconnect $310t$ that extends in a second direction orthogonal to the first direction. The sets of MEOL interconnects $308t_1$, $308t_2$, $308t_3$, $308t_4$ and the MEOL interconnect $310t$ are shorted together, as they are at the same height h (see FIGS. 1, 2) from the bulk silicon substrate 101, 201. The sets of MEOL interconnects $308t_1$, $308t_2$, $308t_3$, $308t_4$ consequently extend as fingers from the MEOL interconnect $310t$. The MEOL interconnect $310t$ is coupled to a first node. In one example, the first node is the top terminal of the capacitor 370. In addition, sets of MEOL interconnects $308b_1$, $308b_2$, $308b_3$, $308b_4$ extend in the first direction across at least a portion of the device. The sets of MEOL interconnects $308b_1$, $308b_2$, $308b_3$, $308b_4$ are coupled together by the MEOL interconnect $310b$ that extends in the second direction. The sets of MEOL interconnects $308b_1$, $308b_2$, $308b_3$, $308b_4$ and the MEOL interconnect $310b$ are shorted together, as they are at the same height h (see FIGS. 1, 2) from the bulk silicon substrate 101, 201. The sets of MEOL interconnects $308b_1$, $308b_2$, $308b_3$, $308b_4$ consequently extend as fingers from the MEOL interconnect $310b$. The MEOL interconnect $310b$ is coupled to a second node. In one example, the second node is the bottom terminal of the capacitor 370. The MEOL interconnects $310t$, $310b$ are identified as 310 in the pattern key. The sets of MEOL interconnects $308t_1$, $308b_1$, the sets of MEOL interconnects $308t_2$, $308b_2$, the sets of MEOL interconnects $308t_3$, $308b_3$, and the sets of MEOL interconnects $308t_4$, $308b_4$ are each interleaved in the first direction. Between the sets of MEOL interconnects $308t_1$, $308b_1$ and the sets of MEOL interconnects $308t_2$, $308b_2$, a plurality of gate interconnects 302 and a plurality of OD regions 305 at 330 may extend in the second direction. The plurality of gate interconnects 302 and the plurality of OD regions 305 at 330 may be interleaved. In addition, between the sets of MEOL interconnects $308t_2$, $308b_2$ and the sets of MEOL interconnects $308t_3$, $308b_3$, a plurality of gate interconnects 302 at 332 may extend in the second direction. Further, between the sets of MEOL interconnects $308t_3$, $308b_3$ and the sets of MEOL interconnects $308t_4$, $308b_4$, a plurality of gate interconnects 302 and a plurality of OD regions 305 at 334 may extend in the second direction. The plurality of gate interconnects 302 and the plurality of OD regions 305 at 334 may be interleaved. The plurality of gate interconnects 302 at 330, 332, 334 and the plurality of OD regions 305 at 330, 334 may be floating and not tied to any node or voltage. The plurality of gate interconnects 302 at 330, 332, 334 and the plurality of OD regions 305 at 330, 334 may be used as fills to meet PC/RX density requirements. Without PC/RX density requirements, additional MEOL interconnects may be utilized at regions 330, 332, 334 to increase the effective capacitance of the sets of interleaved MEOL interconnects $308t_1$, $308t_2$, $308t_3$, $308t_4$, $308b_1$, $308b_2$, $308b_3$, $308b_4$.

The sets of MEOL interconnects $308t_1$, $308t_2$, $308t_3$, $308t_4$ and the MEOL interconnect $310t$ are configured to be at least a portion of the first terminal of the capacitor 370, and the sets of MEOL interconnects $308b_1$, $308b_2$, $308b_3$, $308b_4$ and the MEOL interconnect $310b$ are configured to be at least a portion of the second terminal of the capacitor 370. The additional portion of the capacitor 370 is illustrated in FIG. 8. In one configuration, each MEOL interconnect 308 of the sets of MEOL interconnects $308t_1$, $308t_2$, $308t_3$, $308t_4$ and the sets of MEOL interconnects $308b_1$, $308b_2$, $308b_3$, $308b_4$ is a type B MEOL interconnect, which as discussed above, may be an MP/CB contact layer interconnect 108, 208. Further, in such a configuration, each of the MEOL interconnects $310t$, $310b$ is a type A MEOL interconnect, which as discussed above, may be an MD/CA contact layer interconnect 110, 210.

Figure 6:
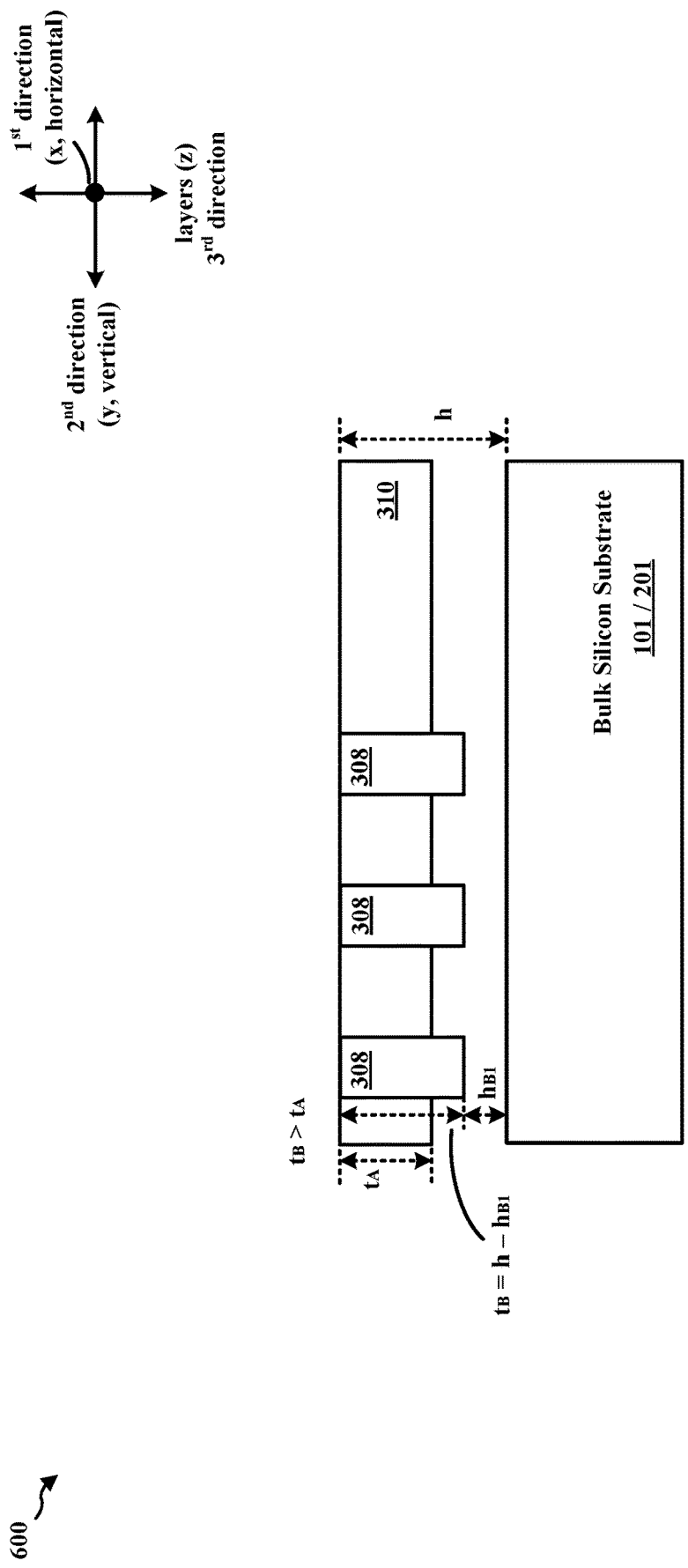
FIG. 6 is a diagram conceptually illustrating a side view of a portion of the high density linear capacitor illustrated in FIG. 5.

A side view in the direction of the arrow 360 in the first direction of the dotted portion is illustrated in FIG. 6. The side view of FIG. 6 illustrates the relative thickness differences between the sets of MEOL interconnects $308t_1$, $308t_2$, $308t_3$, $308t_4$, $308b_1$, $308b_2$, $308b_3$, $308b_4$ and the MEOL interconnects $310t$, $310b$.

FIG. 6 is a diagram 600 conceptually illustrating a side view of a portion of the high density linear capacitor illustrated in FIG. 5. As illustrated in FIG. 6, the type B MEOL interconnects 308 and the type A MEOL interconnects 310 are at a height h from the bulk silicon substrate 101, 201. A bottom surface of the type B MEOL interconnects is at a height $h_{B1}$, which is the height of transistor gates 102, 202. Consequently, the thickness $t_B$ of the type B MEOL interconnects is equal to $h-h_{B1}$. As illustrated in FIG. 6, the thickness $t_B$ of the type B MEOL interconnects is greater than the thickness to of the type A MEOL interconnects.

Figure 7:
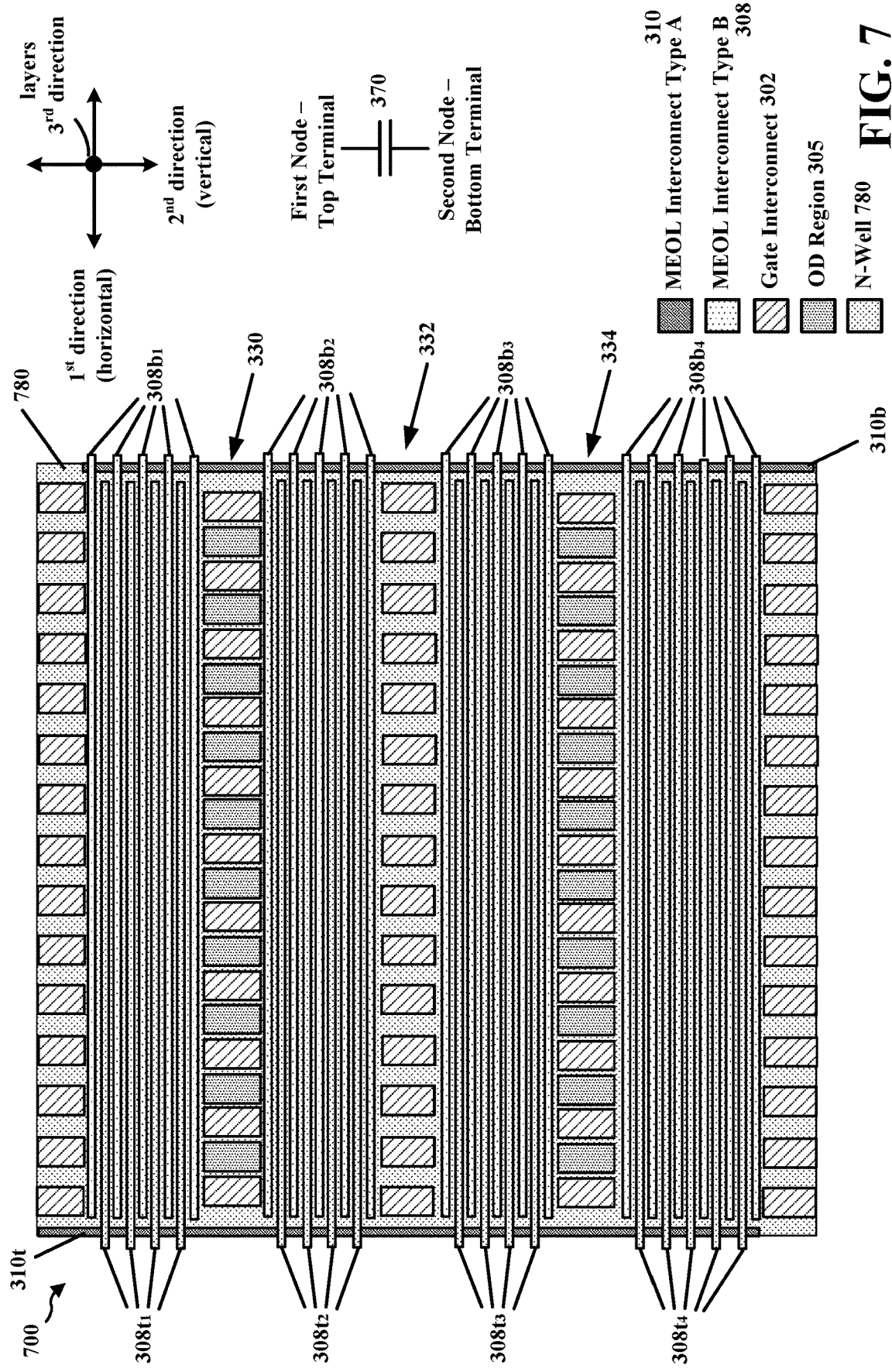
FIG. 7 is a diagram conceptually illustrating a top view of a portion of a high density linear capacitor based on a fourth configuration.

FIG. 7 is a diagram 700 conceptually illustrating a top view of a portion of a high density linear capacitor based on a fourth configuration. As illustrated in FIG. 7, the device illustrated in FIG. 5 may include an n-well 780 that extends across the device, where the n-well 780 is below the sets of interleaved MEOL interconnects $308t_1$, $308t_2$, $308t_3$, $308t_4$, $308b_1$, $308b_2$, $308b_3$, $308b_4$ and below the MEOL interconnects $310t$, $310b$. In a first configuration, the sets of MEOL interconnects $308b_1$, $308b_2$, $308b_3$, $308b_4$ and the MEOL interconnect $310b$ are coupled to the n-well 780. In such a configuration, the first node (top terminal of the capacitor 370) is shielded from the substrate. Shielding the first node (top terminal) from the substrate through tying the second node (bottom terminal) to the n-well reduces parasitic capacitances on the first node (e.g., from 4% to 0.6% of the total capacitance). However, in such a configuration, the second node (bottom terminal) will have a greater parasitic capacitance (e.g., increasing from 4.5% to 20%-22% of the total capacitance) that is non-linear and will require a larger drive strength through a signal path including the capacitor 370. In a second configuration, a third node is coupled to the n-well 780, where the third node is unconnected to the first node (top terminal of the capacitor 370) and the second node (bottom terminal of the capacitor 370).

Figure 9:
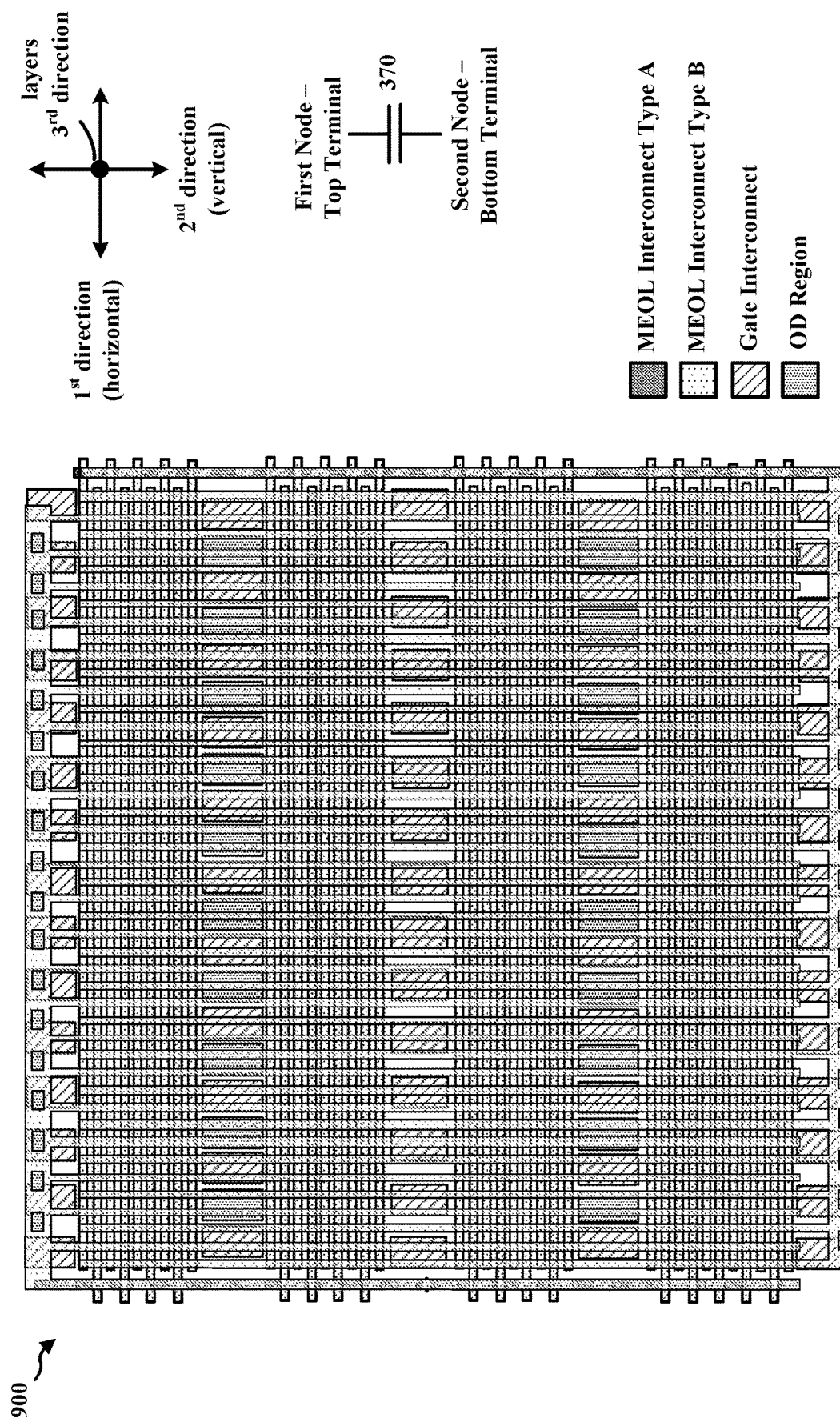
FIG. 9 is a diagram conceptually illustrating a top view of the portions of the high density linear capacitors of FIGS. 5, 8 together.

FIG. 8 is a diagram 800 conceptually illustrating a top view of an upper portion of a high density linear capacitor based on a first configuration. FIG. 9 is a diagram 900 conceptually illustrating a top view of the portions of the high density linear capacitors of FIGS. 5, 8 together. As illustrated in FIG. 8, the upper portion of the capacitor 370 (which may be referred to as a MOM capacitor) includes a first comb structure $840t$ with fingers extending in the second direction and a second comb structure $840b$ with fingers extending in the second direction. The fingers of the first and second comb structures $840t$, $840b$ are interleaved. Each of the first comb structure $840t$ and the second comb structure $840b$ may include fingers on metal layers between $M_1$ to $M_x$, where x>1. For example, if x=3 as illustrated in FIG. 8, the first comb structure $840t$ and the second comb structure $840b$ would include fingers on the lower metal layers $M_1$, $M_2$, and $M_3$. For another example, if x=5, the first comb structure $840t$ and the second comb structure $840b$ would include fingers on the lower metal layers $M_1$, $M_2$, and $M_3$, and on the central metal layers including a metal 4 ($C_4$) layer and a metal 5 ($C_5$) layer (which are wider and further spaced apart). The comb structure $840t$ includes a side terminal $842t$ that connects to the sets of MEOL interconnects $308t_1$, $308t_2$, $308t_3$, $308t_4$ in FIGS. 3, 4 or to the MEOL interconnect $310t$ in FIGS. 5, 7 (see FIG. 9). The comb structure $840b$ includes a side terminal $842b$ that connects to the sets of MEOL interconnects $308b_1$, $308b_2$, $308b_3$, $308b_4$ in FIGS. 3, 4 or to the MEOL interconnect $310b$ in FIGS. 5, 7 (see FIG. 9). The first comb structure $840t$ and the sets of MEOL interconnects $308t_1$, $308t_2$, $308t_3$, $308t_4$ are together the top terminal (i.e., first node) of the capacitor 370. The second comb structure $840b$ and the sets of MEOL interconnects $308b_1$, $308b_2$, $308b_3$, $308b_4$ are together the bottom terminal (i.e., second node) of the capacitor 370. As illustrated in FIG. 9, the MEOL capacitor of FIG. 5 and the BEOL MOM capacitor of FIG. 8 are coupled in parallel, providing for one MEOL-BEOL capacitor 370 with increased density.

Figure 10:
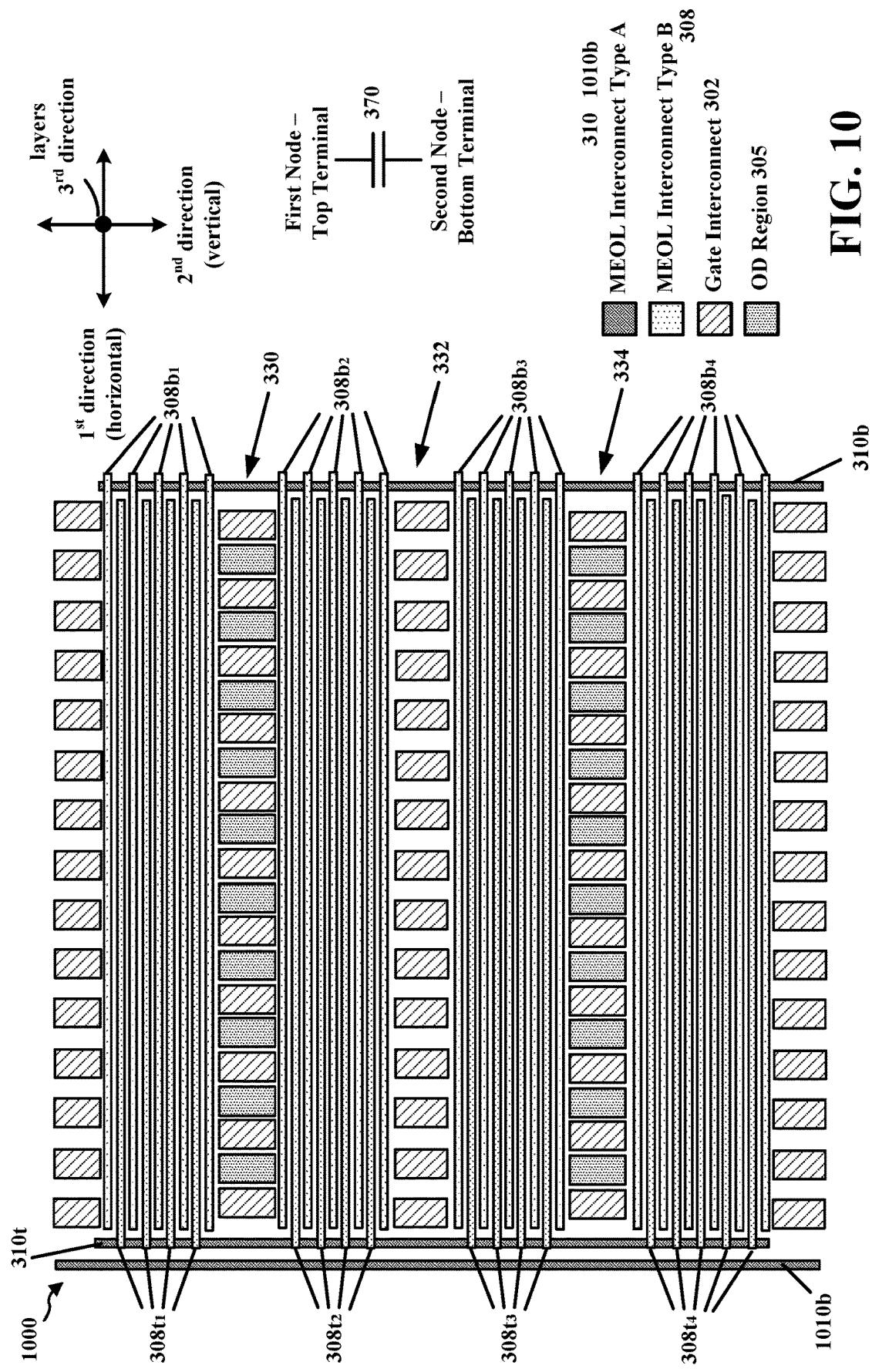
FIG. 10 is a diagram conceptually illustrating a top view of a portion of a high density linear capacitor based on a fifth configuration.

FIG. 10 is a diagram 1000 conceptually illustrating a top view of a portion of a high density linear capacitor based on a fifth configuration. As illustrated in FIG. 10, sets of MEOL interconnects $308t_1$, $308t_2$, $308t_3$, $308t_4$ extend in a first direction across at least a portion of the device. The sets of MEOL interconnects $308t_1$, $308t_2$, $308t_3$, $308t_4$ are coupled together by the MEOL interconnect $310t$ that extends in the second direction. The sets of MEOL interconnects $308t_1$, $308t_2$, $308t_3$, $308t_4$ and the MEOL interconnect $310t$ are shorted together. The sets of MEOL interconnects $308t_1$, $308t_2$, $308t_3$, $308t_4$ consequently extend as fingers from the MEOL interconnect $310t$. The MEOL interconnect $310t$ is coupled to a first node. In one example, the first node is the top terminal of the capacitor 370. In addition, sets of MEOL interconnects $308b_1$, $308b_2$, $308b_3$, $308b_4$ extend in the first direction across at least a portion of the device. The sets of MEOL interconnects $308b_1$, $308b_2$, $308b_3$, $308b_4$ are coupled together by the MEOL interconnect $310b$ that extends in the second direction. The sets of MEOL interconnects $308b_1$, $308b_2$, $308b_3$, $308b_4$ and the MEOL interconnect $310b$ are shorted together. The sets of MEOL interconnects $308b_1$, $308b_2$, $308b_3$, $308b_4$ consequently extend as fingers from the MEOL interconnect $310b$. The MEOL interconnect $310b$ is coupled to a second node. In one example, the second node is the bottom terminal of the capacitor 370. The sets of MEOL interconnects $308t_1$, $308b_1$, the sets of MEOL interconnects $308t_2$, $308b_2$, the sets of MEOL interconnects $308t_3$, $308b_3$, and the sets of MEOL interconnects $308t_4$, $308b_4$ are each interleaved in the first direction.

A MEOL interconnect $1010b$ adjacent to the MEOL interconnect $310t$ is coupled to the second node. The MEOL interconnect $1010b$ provides shielding to the MEOL interconnect $310t$ so that the MEOL interconnect $310t$ is more isolated from nearby local/global routing interconnects that could couple to the MEOL interconnect $310t$ and cause parasitic capacitance on the MEOL interconnect $310t$. Such a design may be suitable for applications where the top terminal of the capacitor 370 should have relatively lower parasitic capacitance.

Between the sets of MEOL interconnects $308t_1$, $308b_1$ and the sets of MEOL interconnects $308t_2$, $308b_2$, a plurality of gate interconnects 302 and a plurality of OD regions 305 at 330 may extend in the second direction. The plurality of gate interconnects 302 and the plurality of OD regions 305 at 330 may be interleaved. In addition, between the sets of MEOL interconnects $308t_2$, $308b_2$ and the sets of MEOL interconnects $308t_3$, $308b_3$, a plurality of gate interconnects 302 at 332 may extend in the second direction. Further, between the sets of MEOL interconnects $308t_3$, $308b_3$ and the sets of MEOL interconnects $308t_4$, $308b_4$, a plurality of gate interconnects 302 and a plurality of OD regions 305 at 334 may extend in the second direction. The plurality of gate interconnects 302 and the plurality of OD regions 305 at 334 may be interleaved. The plurality of gate interconnects 302 at 330, 332, 334 and the plurality of OD regions 305 at 330, 334 may be floating and not tied to any node or voltage. The plurality of gate interconnects 302 at 330, 332, 334 and the plurality of OD regions 305 at 330, 334 may be used as fills to meet PC/RX density requirements. Without PC/RX density requirements, additional MEOL interconnects may be utilized at regions 330, 332, 334 to increase the effective capacitance of the sets of interleaved MEOL interconnects $308t_1$, $308t_2$, $308t_3$, $308t_4$, $308b_1$, $308b_2$, $308b_3$, $308b_4$.

Figure 12:
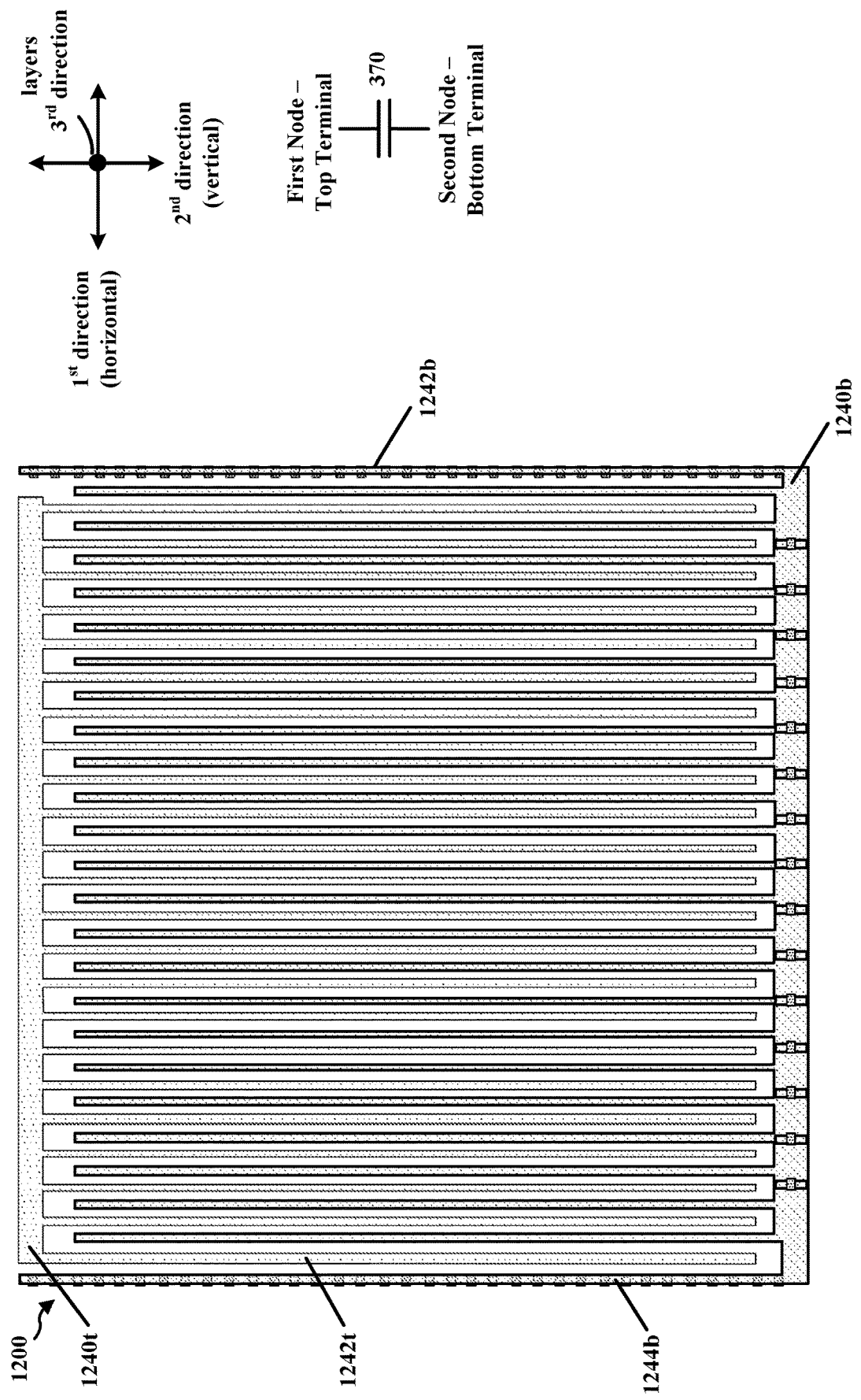
FIG. 12 is a diagram conceptually illustrating a top view of an upper portion of a high density linear capacitor based on a second configuration.

The sets of MEOL interconnects $308t_1$, $308t_2$, $308t_3$, $308t_4$ and the MEOL interconnect $310t$ are configured to be at least a portion of the first terminal of the capacitor 370, and the sets of MEOL interconnects $308b_1$, $308b_2$, $308b_3$, $308b_4$ and the MEOL interconnects $310b$, $1010b$ are configured to be at least a portion of the second terminal of the capacitor 370. The additional portion of the capacitor 370 is illustrated in FIG. 12. As discussed above, each MEOL interconnect 308 of the sets of MEOL interconnects $308t_1$, $308t_2$, $308t_3$, $308t_4$ and the sets of MEOL interconnects $308b_1$, $308b_2$, $308b_3$, $308b_4$ may be a type B MEOL interconnect, which may be an MP/CB contact layer interconnect 108, 208. In addition, each of the MEOL interconnects $310t$, $310b$, $1010b$ may be a type A MEOL interconnect, which may be an MD/CA contact layer interconnect 110, 210.

Figure 11:
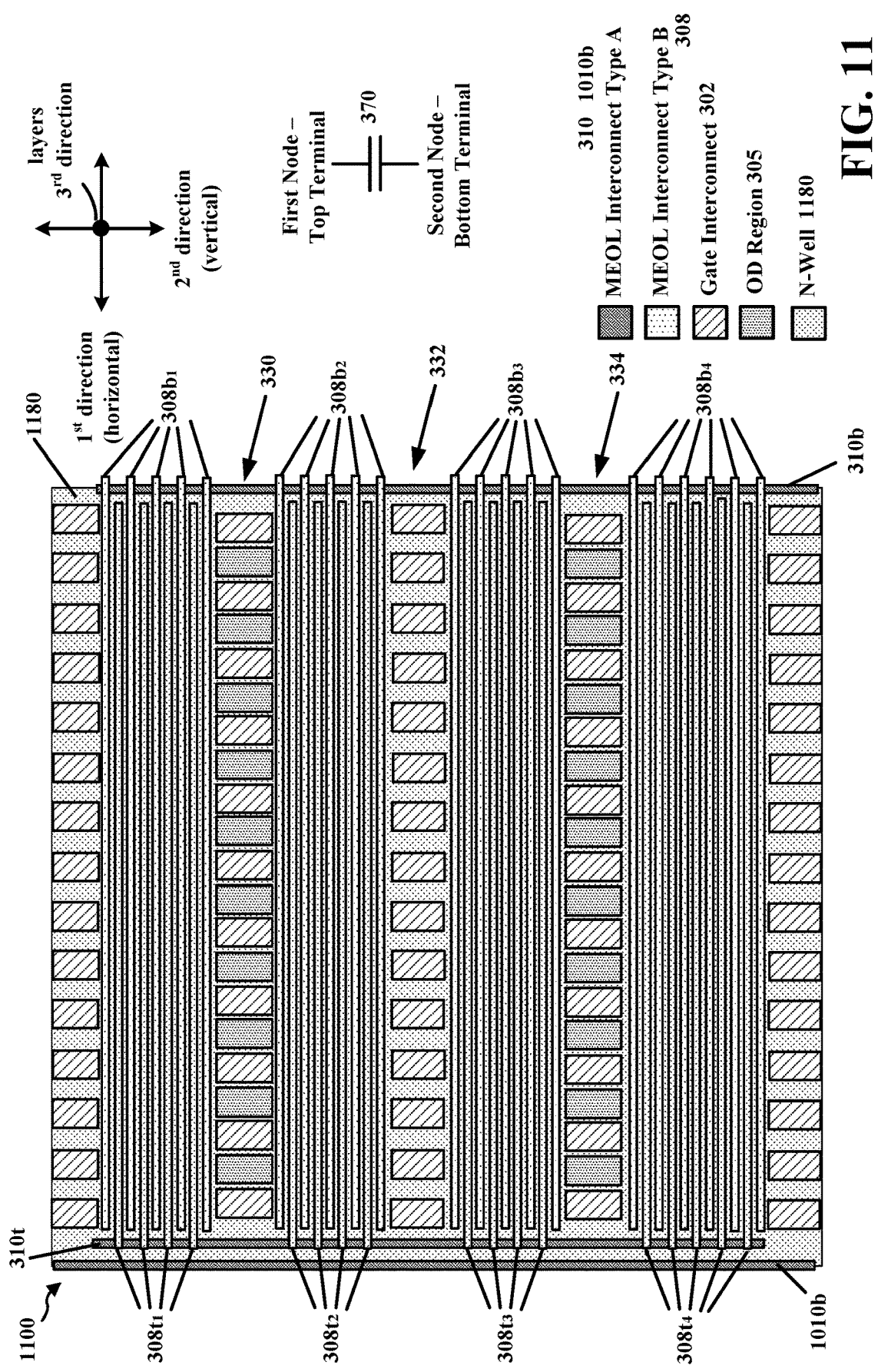
FIG. 11 is a diagram conceptually illustrating a top view of a portion of a high density linear capacitor based on a sixth configuration.

FIG. 11 is a diagram 1100 conceptually illustrating a top view of a portion of a high density linear capacitor based on a sixth configuration. As illustrated in FIG. 11, the device illustrated in FIG. 10 may include an n-well 1180 that extends across the device, where the n-well 1180 is below the sets of interleaved MEOL interconnects $308t_1$, $308t_2$, $308t_3$, $308t_4$, $308b_1$, $308b_2$, $308b_3$, $308b_4$ and below the MEOL interconnects $310t$, $310b$. In a first configuration, the sets of MEOL interconnects $308b_1$, $308b_2$, $308b_3$, $308b_4$ and the MEOL interconnects $310b$, $1010b$ are coupled to the n-well 1180. In such a configuration, the first node (top terminal of the capacitor 370) is shielded from the substrate. Shielding the first node (top terminal) from the substrate through tying the second node (bottom terminal) to the n-well reduces parasitic capacitances on the first node (e.g., from 4% to 0.6% of the total capacitance). However, in such a configuration, the second node (bottom terminal) will have a greater parasitic capacitance (e.g., increasing from 4.5% to 20%-22% of the total capacitance) that is non-linear and will require a larger drive strength through a signal path including the capacitor 370. In a second configuration, a third node is coupled to the n-well 1180, where the third node is unconnected to the first node (top terminal of the capacitor 370) and the second node (bottom terminal of the capacitor 370).

Figure 13:
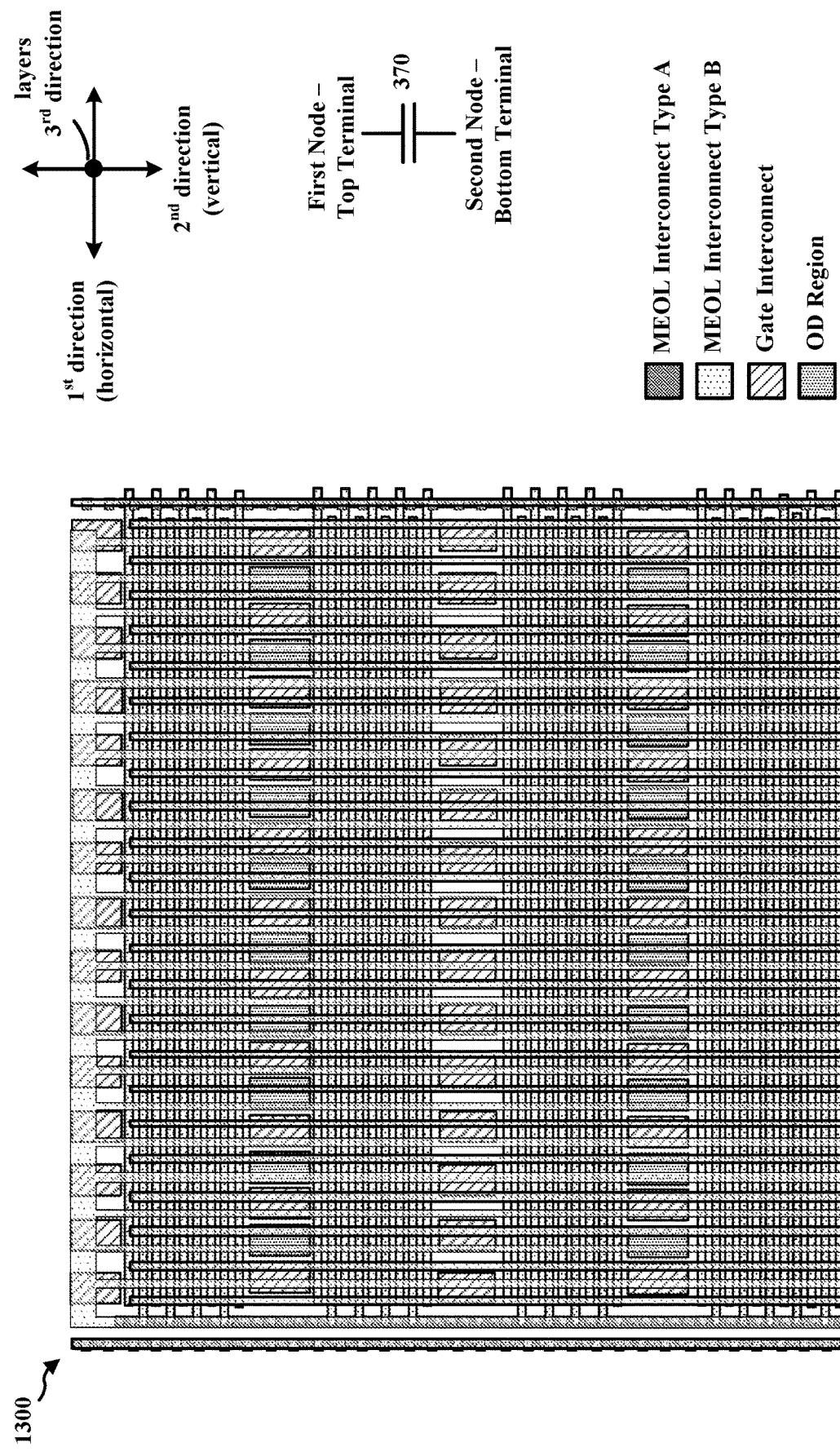
FIG. 13 is a diagram conceptually illustrating a top view of the portions of the high density linear capacitors of FIGS. 10, 12 together.

FIG. 12 is a diagram 1200 conceptually illustrating a top view of an upper portion of a high density linear capacitor based on a second configuration. FIG. 13 is a diagram 1300 conceptually illustrating a top view of the portions of the high density linear capacitors of FIGS. 10, 12 together. As illustrated in FIG. 12, the upper portion of the capacitor 370 (i.e., MOM capacitor) includes a first comb structure $1240t$ with fingers extending in the second direction and a second comb structure $1240b$ with fingers extending in the second direction. The fingers of the first and second comb structures $1240t$, $1240b$ are interleaved. Each of the first comb structure $1240t$ and the second comb structure $1240b$ may include fingers on metal layers between $M_1$ to $M_x$, where $x>1$. For example, if $x=3$ as illustrated in FIG. 12, the first comb structure $1240t$ and the second comb structure $1240b$ would include fingers on the lower metal layers $M_1$, $M_2$, and $M_3$. For another example, if $x=5$, the first comb structure $1240t$ and the second comb structure $1240b$ would include fingers on the lower metal layers $M_1$, $M_2$, and $M_3$, and on the central metal layers $C_4$ and $C_5$. The comb structure $1240t$ includes a side terminal $1242t$ that connects to the sets of MEOL interconnects $308t_1$, $308t_2$, $308t_3$, $308t_4$ (as described in relation to FIGS. 8, 9) or to the MEOL interconnect $310t$ in FIGS. 10, 11 (see FIG. 13). The comb structure $1240b$ includes a side terminal $1242b$ that connects to the sets of MEOL interconnects $308b_1$, $308b_2$, $308b_3$, $308b_4$ (as described in relation to FIGS. 8, 9) or to the MEOL interconnect $310b$ in FIGS. 10, 11 (see FIG. 13). The comb structure $1240b$ further includes side terminal $1244b$ that connects to the MEOL interconnect $1010b$ in FIGS. 10, 11 (see FIG. 13). The side terminal $1244b$ connects the second node (i.e., bottom terminal) to the MEOL interconnect $1010b$ so that the MEOL interconnect $1010b$ may shield the MEOL interconnect $310t$ and isolate the MEOL interconnect $310t$ from nearby local/global routing interconnects that could couple to the MEOL interconnect $310t$ and cause parasitic capacitance on the MEOL interconnect $310t$. The first comb structure $1240t$ and the sets of MEOL interconnects $308t_1$, $308t_2$, $308t_3$, $308t_4$ are together the top terminal (i.e., first node) of the capacitor 370. The second comb structure $1240b$ and the sets of MEOL interconnects $308b_1$, $308b_2$, $308b_3$, $308b_4$ are together the bottom terminal (i.e., second node) of the capacitor 370. As illustrated in FIG. 13, the MEOL capacitor of FIG. 10 and the BEOL MOM capacitor of FIG. 12 are coupled in parallel, providing for one MEOL-BEOL capacitor 370 with increased density.

Figure 14:
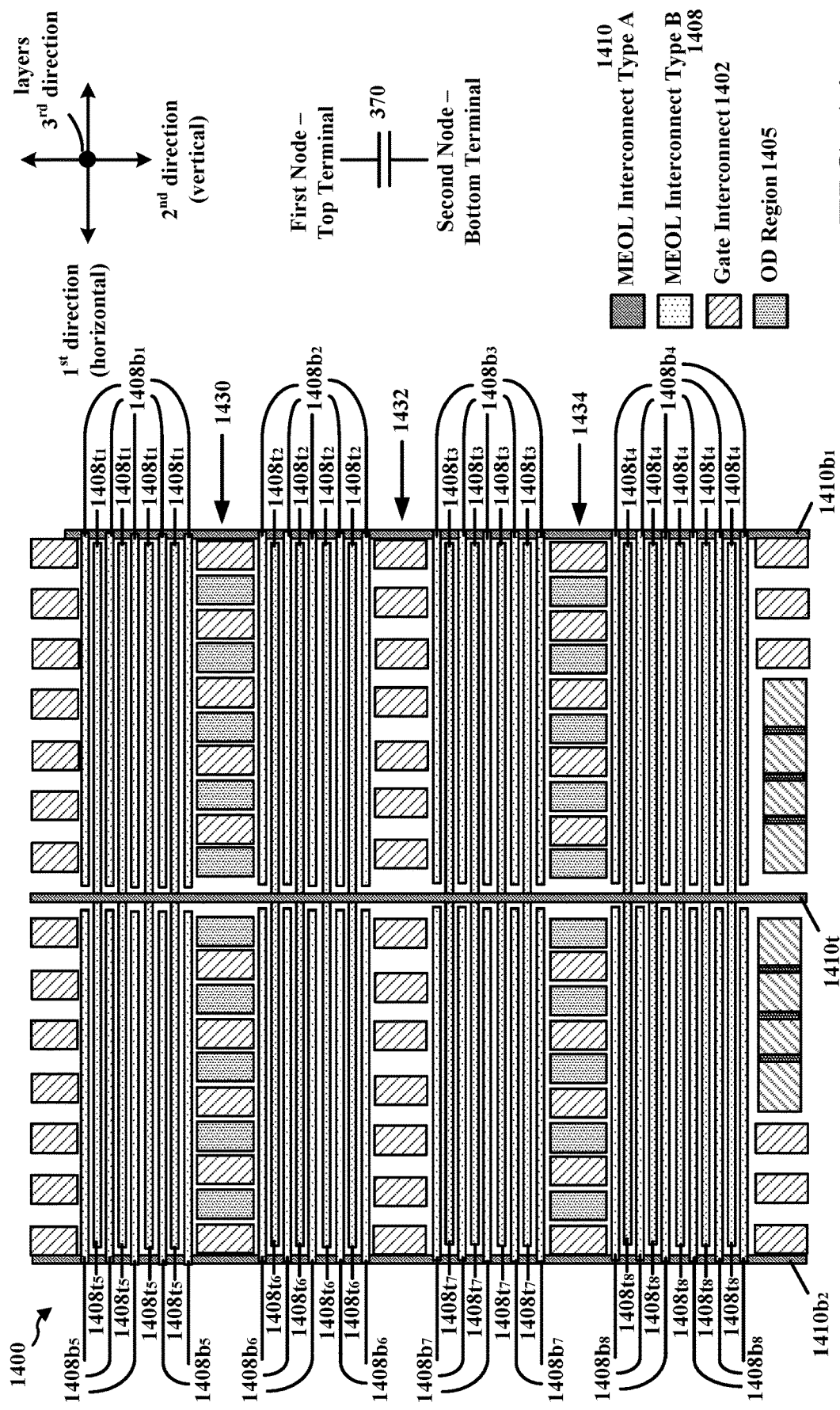
FIG. 14 is a diagram conceptually illustrating a top view of a portion of a high density linear capacitor based on a seventh configuration.

FIG. 14 is a diagram 1400 conceptually illustrating a top view of a portion of a high density linear capacitor based on a seventh configuration. As illustrated in FIG. 14, the MEOL interconnect $1410t$ extends in a second direction across approximately a middle of the device. The sets of MEOL interconnects $1408t_1$, $1408t_2$, $1408t_3$, $1408t_4$, $1408t_5$, $1408t_6$, $1408t_7$, $1408t_8$ extend as fingers from the MEOL interconnect $1410t$ in a first direction across a portion of the device, where the first direction is orthogonal to the second direction. The sets of MEOL interconnects $1408t_1$, $1408t_2$, $1408t_3$, $1408t_4$, $1408t_5$, $1408t_6$, $1408t_7$, $1408t_8$ are coupled together by the MEOL interconnect $1410t$. The sets of MEOL interconnects $1408t_1$, $1408t_2$, $1408t_3$, $1408t_4$, $1408t_5$, $1408t_6$, $1408t_7$, $1408t_8$ and the MEOL interconnect $1410t$ are shorted together, as they are at the same height h (see FIGS. 1, 2) from the bulk silicon substrate 101, 201. The MEOL interconnect $1410t$ is coupled to a first node. In one example, the first node is the top terminal of the capacitor 370.

The MEOL interconnect $1410b_1$ extends in the second direction across a first side (right side in the figure) of the device. The sets of MEOL interconnects $1408b_1$, $1408b_2$, $1408b_3$, $1408b_4$ extend as fingers from the MEOL interconnect $1410b_1$ in the first direction across a portion of the device. The sets of MEOL interconnects $1408b_1$, $1408b_2$, $1408b_3$, $1408b_4$ are coupled together by the MEOL interconnect $1410b_1$. The sets of MEOL interconnects $1408b_1$, $1408b_2$, $1408b_3$, $1408b_4$ and the MEOL interconnect $1410b_1$ are shorted together, as they are at the same height h (see FIGS. 1, 2) from the bulk silicon substrate 101, 201. The MEOL interconnect $1410b_1$ is coupled to a second node. In one example, the second node is the bottom terminal of the capacitor 370.

The MEOL interconnect $1410b_2$ extends in the second direction across a second side (left side in the figure) of the device. The MEOL interconnects $1410t$, $1410b_1$, $1410b_2$ are identified as 1410 in the pattern key. The sets of MEOL interconnects $1408b_5$, $1408b_6$, $1408b_7$, $1408b_8$ extend as fingers from the MEOL interconnect $1410b_2$ in the first direction across a portion of the device. The sets of MEOL interconnects $1408b_5$, $1408b_6$, $1408b_7$, $1408b_8$ are coupled together by the MEOL interconnect $1410b_2$. The sets of MEOL interconnects $1408b_5$, $1408b_6$, $1408b_7$, $1408b_8$ and the MEOL interconnect $1410b_2$ are shorted together, as they are at the same height h (see FIGS. 1, 2) from the bulk silicon substrate 101, 201. The MEOL interconnect $1410b_2$ is coupled to the second node.

The sets of MEOL interconnects $1408b_1$, $1408t_1$, the sets of MEOL interconnects $1408b_2$, $1408t_2$, the sets of MEOL interconnects $1408b_3$, $1408t_3$, and the sets of MEOL interconnects $1408b_4$, $1408t_4$ are each interleaved in the first direction on a first half of the device. The sets of MEOL interconnects $1408b_5$, $1408t_5$, the sets of MEOL interconnects $1408b_6$, $1408t_6$, the sets of MEOL interconnects $1408b_7$, $1408t_7$, and the sets of MEOL interconnects $1408b_8$, $1408t_8$ are each interleaved in the first direction on a second half of the device.

In this configuration, the MEOL interconnects $1410b_1$, $1410b_2$ shield the MEOL interconnects $1408t_1$, $1408t_2$, $1408t_3$, $1408t_4$, $1408t_5$, $1408t_6$, $1408t_7$, $1408t_8$ and the MEOL interconnect $1410t$, thereby reducing a coupling of the first node (top terminal) to local/global routing interconnects that could increase a parasitic capacitance on the first node. Further, the MEOL interconnects $1408t_1$, $1408t_2$, $1408t_3$, $1408t_4$, $1408t_5$, $1408t_6$, $1408t_7$, $1408t_8$, $1408b_1$, $1408b_2$, $1408b_3$, $1408b_4$, $1408b_5$, $1408b_6$, $1408b_7$, $1408b_8$ (identified as 1408 in the pattern key) are each approximately half the length of the MEOL interconnects 308. The reduced length of the MEOL interconnects 1408 significantly reduces the resistance of the fingers compared to the fingers illustrated in FIGS. 3-5, 7, 9-11, and 13, thereby increasing the quality (Q) factor (Q-factor) of the capacitor 370. The Q-factor is inversely proportional to the resistance. As the resistance of the fingers is effectively halved, the Q-factor is effectively doubled.

Between the sets of MEOL interconnects $1408t_1$, $1408b_1$, $1408t_5$, $1408b_5$ and the sets of MEOL interconnects $1408t_2$, $1408b_2$, $1408t_6$, $1408b_6$, a plurality of gate interconnects 1402 and a plurality of OD regions 1405 at 1430 may extend in the second direction. The plurality of gate interconnects 1402 and the plurality of OD regions 1405 at 1430 may be interleaved. In addition, between the sets of MEOL interconnects $1408t_2$, $1408b_2$, $1408t_6$, $1408b_6$ and the sets of MEOL interconnects $1408t_3$, $1408b_3$, $1408t_7$, $1408b_7$, a plurality of gate interconnects 1402 at 1432 may extend in the second direction. Further, between the sets of MEOL interconnects $1408t_3$, $1408b_3$, $1408t_7$, $1408b_7$ and the sets of MEOL interconnects $1408t_4$, $1408b_4$, $1408t_8$, $1408b_8$, a plurality of gate interconnects 1402 and a plurality of OD regions 1405 at 1434 may extend in the second direction. The plurality of gate interconnects 1402 and the plurality of OD regions 1405 at 1434 may be interleaved. The plurality of gate interconnects 1402 at 1430, 1432, 1434 and the plurality of OD regions 1405 at 1430, 1434 may be floating and not tied to any node or voltage. The plurality of gate interconnects 1402 at 1430, 1432, 1434 and the plurality of OD regions 1405 at 1430, 1434 may be used as fills to meet PC/RX density requirements. Without PC/RX density requirements, additional MEOL interconnects may be utilized at regions 1430, 1432, 1434 to increase the effective capacitance of the sets of interleaved MEOL interconnects $1408t_1$, $1408t_2$, $1408t_3$, $1408t_4$, $1408t_5$, $1408t_6$, $1408t_7$, $1408t_8$, $1408b_1$, $1408b_2$, $1408b_3$, $1408b_4$, $1408b_5$, $1408b_6$, $1408b_7$, $1408b_8$.

The sets of MEOL interconnects $1408t_1$, $1408t_2$, $1408t_3$, $1408t_4$, $1408t_5$, $1408t_6$, $1408t_7$, $1408t_8$ and the MEOL interconnect $1410t$ are configured to be at least a portion of the first terminal of the capacitor 370, and the sets of MEOL interconnects $1408b_1$, $1408b_2$, $1408b_3$, $1408b_4$, $1408b_5$, $1408b_6$, $1408b_7$, $1408b_8$ and the MEOL interconnects $1410b_1$, $1410b_2$ are configured to be at least a portion of the second terminal of the capacitor 370. The additional portion of the capacitor 370 is on higher metal layers, such as for example, the metal layers $M_1$, $M_2$, $M_3$, $C_4$, $C_5$. In one configuration, each MEOL interconnect 1408 of the sets of MEOL interconnects $1408t_1$, $1408t_2$, $1408t_3$, $1408t_4$, $1408t_5$, $1408t_6$, $1408t_7$, $1408t_8$ and the sets of MEOL interconnects $1408b_1$, $1408b_2$, $1408b_3$, $1408b_4$, $1408b_5$, $1408b_6$, $1408b_7$, $1408b_8$ is a type B MEOL interconnect, which as discussed above, may be an MP/CB contact layer interconnect 108, 208. Further, in such a configuration, each of the MEOL interconnects $1410t$, $1410b_1$, $1410b_2$ is a type A MEOL interconnect, which as discussed above, may be an MD/CA contact layer interconnect 110, 210.

Figure 15:
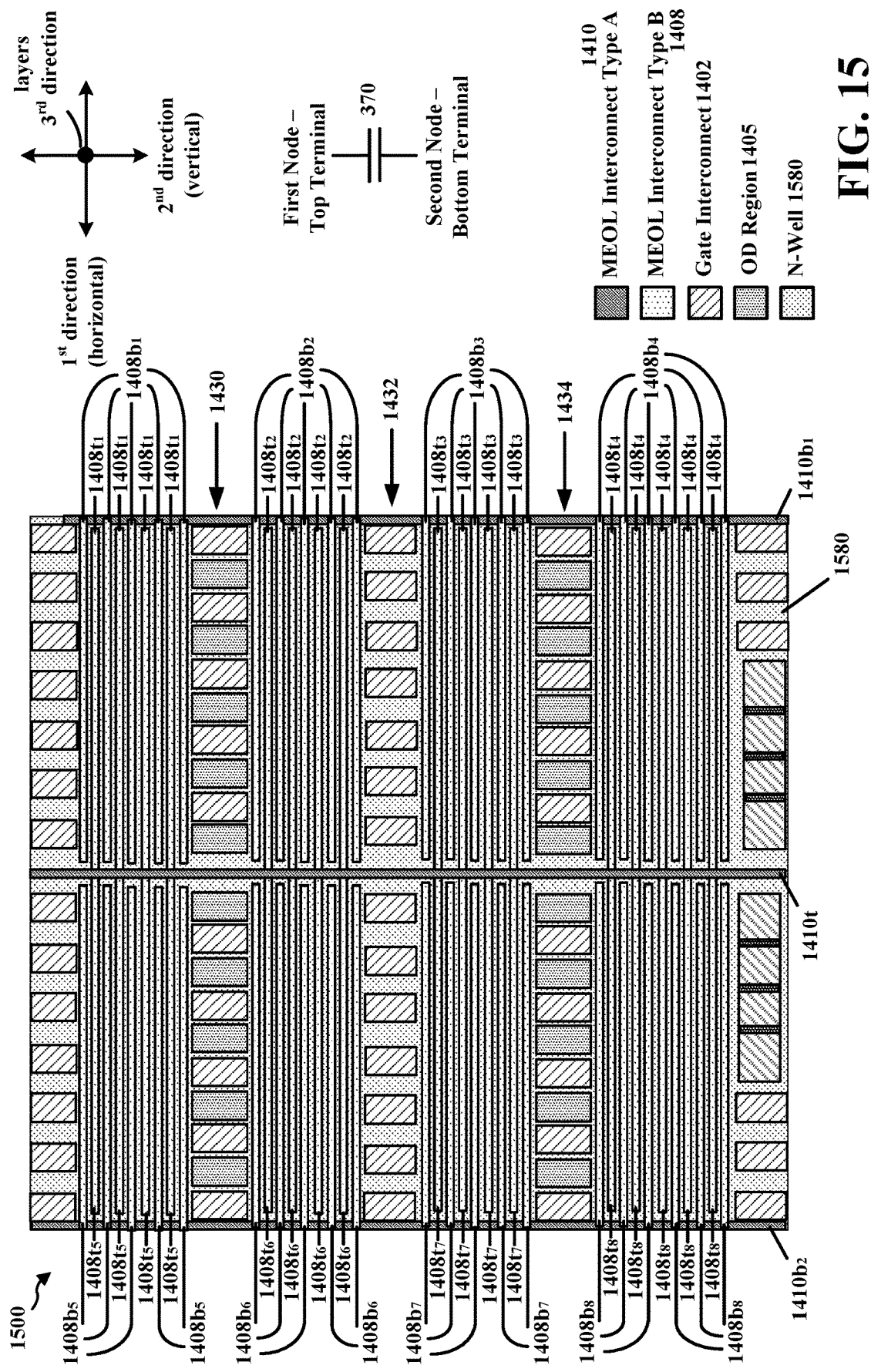
FIG. 15 is a diagram conceptually illustrating a top view of a portion of a high density linear capacitor based on an eighth configuration.

FIG. 15 is a diagram 1500 conceptually illustrating a top view of a portion of a high density linear capacitor based on an eighth configuration. As illustrated in FIG. 15, the device illustrated in FIG. 14 may include an n-well 1580 that extends across the device, where the n-well 1580 is below the sets of interleaved MEOL interconnects $1408t_1$, $1408t_2$, $1408t_3$, $1408t_4$, $1408t_5$, $1408t_6$, $1408t_7$, $1408t_8$, $1408b_1$, $1408b_2$, $1408b_3$, $1408b_4$, $1408b_5$, $1408b_6$, $1408b_7$, $1408b_8$ and below the MEOL interconnects $1410t$, $1410b_1$, $1410b_2$. In a first configuration, the sets of MEOL interconnects $1408b_1$, $1408b_2$, $1408b_3$, $1408b_4$, $1408b_5$, $1408b_6$, $1408b_7$, $1408b_8$ and the MEOL interconnects $1410b_1$, $1410b_2$ are coupled to the n-well 1580. In such a configuration, the first node (top terminal of the capacitor 370) is shielded from the substrate. Shielding the first node (top terminal) from the substrate through tying the second node (bottom terminal) to the n-well reduces parasitic capacitances on the first node (e.g., from 4% to 0.6% of the total capacitance). However, in such a configuration, the second node (bottom terminal) will have a greater parasitic capacitance (e.g., increasing from 4.5% to 20%-22% of the total capacitance) that is non-linear and will require a larger drive strength through a signal path including the capacitor 370. In a second configuration, a third node is coupled to the n-well 1580, where the third node is unconnected to the first node (top terminal of the capacitor 370) and the second node (bottom terminal of the capacitor 370).

Figure 16:
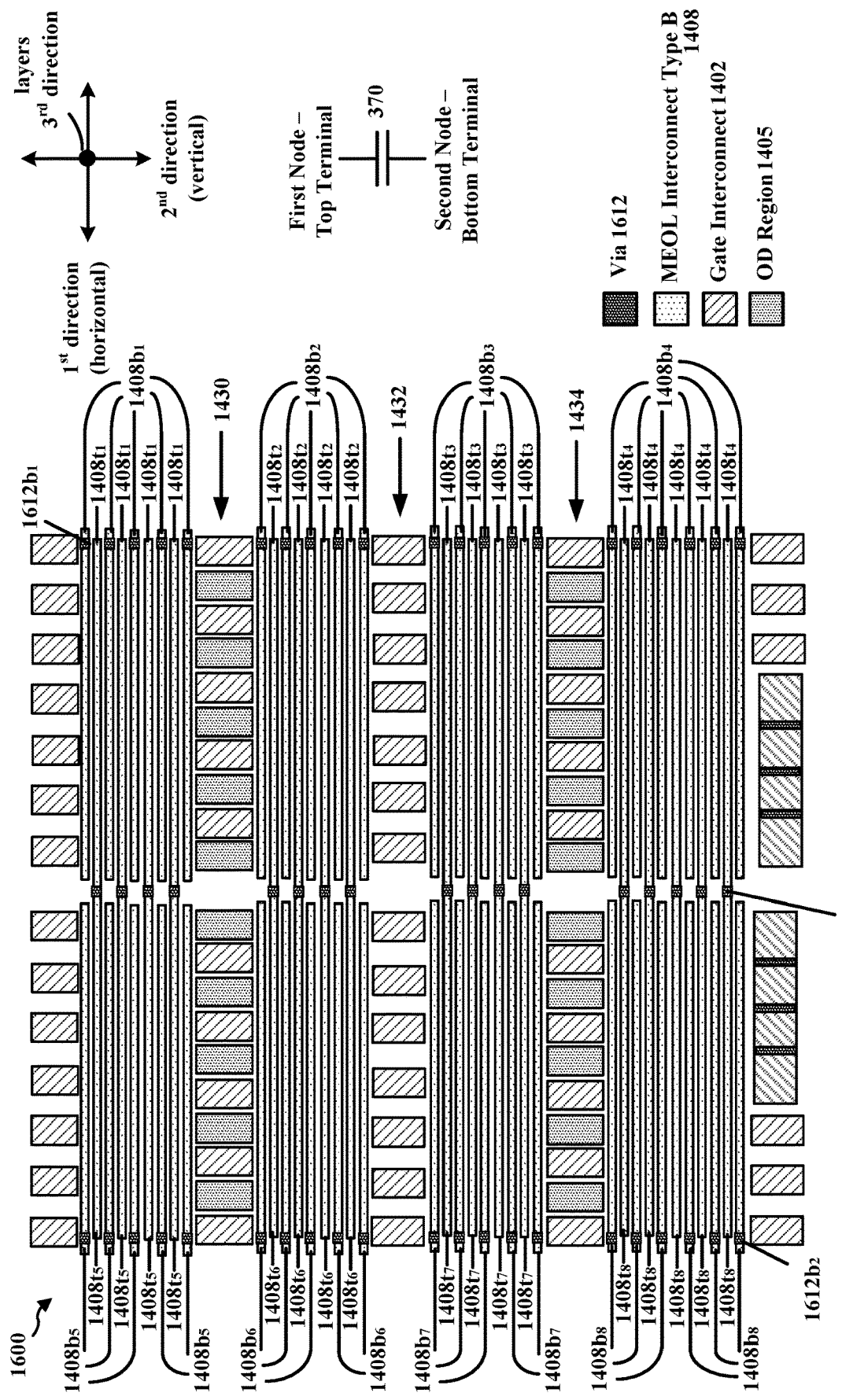
FIG. 16 is a diagram conceptually illustrating a top view of a portion of a high density linear capacitor based on a ninth configuration.

FIG. 16 is a diagram 1600 conceptually illustrating a top view of a portion of a high density linear capacitor based on a ninth configuration. As illustrated in FIG. 16 and similar to the configuration of FIG. 3, the sets of MEOL interconnects $1408t_1$, $1408t_2$, $1408t_3$, $1408t_4$, $1408t_5$, $1408t_6$, $1408t_7$, $1408t_8$ may be coupled to the first node through the vias $1612t$, the sets of MEOL interconnects $1408b_1$, $1408b_2$, $1408b_3$, $1408b_4$ may be coupled to the second node through vias $1612b_1$, and the sets of MEOL interconnects $1408b_5$, $1408b_6$, $1408b_7$, $1408b_8$ may be coupled to the second node through vias $1612b_2$ without use of the type A MEOL interconnects 1410. The vias $1612t$, $1612b_1$, $1612b_2$ are identified as 1612 in the pattern key.

Figure 17:
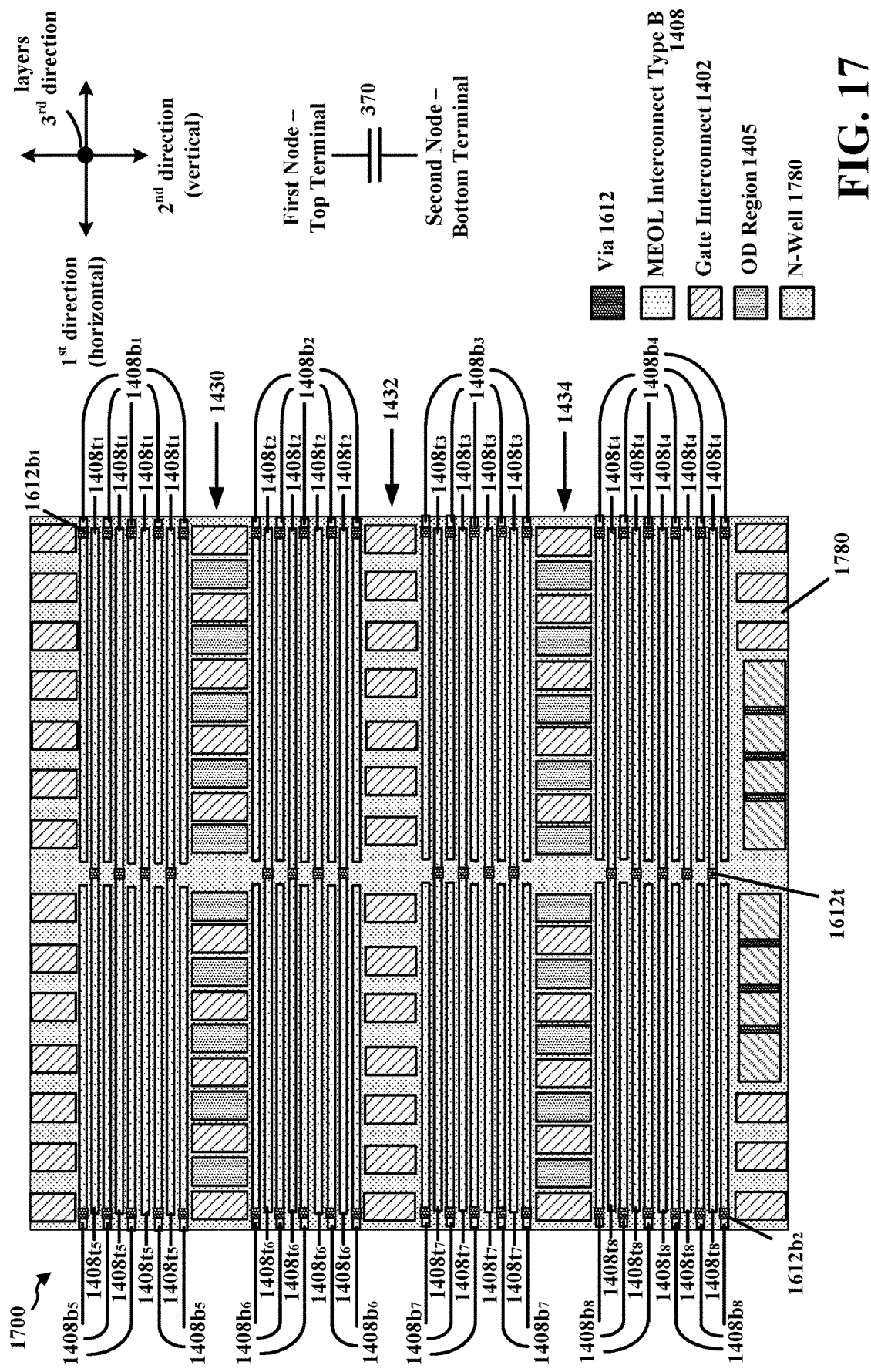
FIG. 17 is a diagram conceptually illustrating a top view of a portion of a high density linear capacitor based on a tenth configuration.

FIG. 17 is a diagram 1700 conceptually illustrating a top view of a portion of a high density linear capacitor based on a tenth configuration. As illustrated in FIG. 17, the device illustrated in FIG. 16 may include an n-well 1780 that extends across the device, where the n-well 1780 is below the sets of interleaved MEOL interconnects $1408t_1$, $1408t_2$, $1408t_3$, $1408t_4$, $1408t_5$, $1408t_6$, $1408t_7$, $1408t_8$, $1408b_1$, $1408b_2$, $1408b_3$, $1408b_4$, $1408b_5$, $1408b_6$, $1408b_7$, $1408b_8$ and below the MEOL interconnects $1410t$, $1410b_1$, $1410b_2$. In a first configuration, the sets of MEOL interconnects $1408b_1$, $1408b_2$, $1408b_3$, $1408b_4$, $1408b_5$, $1408b_6$, $1408b_7$, $1408b_8$ and the MEOL interconnects $1410b_1$, $1410b_2$ are coupled to the n-well 1780. In such a configuration, the first node (top terminal of the capacitor 370) is shielded from the substrate. Shielding the first node (top terminal) from the substrate through tying the second node (bottom terminal) to the n-well reduces parasitic capacitances on the first node (e.g., from 4% to 0.6% of the total capacitance). However, in such a configuration, the second node (bottom terminal) will have a greater parasitic capacitance (e.g., increasing from 4.5% to 20%-22% of the total capacitance) that is non-linear and will require a larger drive strength through a signal path including the capacitor 370. In a second configuration, a third node is coupled to the n-well 1780, where the third node is unconnected to the first node (top terminal of the capacitor 370) and the second node (bottom terminal of the capacitor 370).

Referring again to FIGS. 3-17, a device includes a first plurality of MEOL interconnects (e.g., $308b_1$, $308b_2$; $1408b_1$, $1408b_2$) coupled to a second node (e.g., bottom terminal of the capacitor 370) and extending in a first direction across at least a portion of the device. The first plurality of MEOL interconnects (e.g., $308b_1$, $308b_2$; $1408b_1$, $1408b_2$) includes at least a first subset of MEOL second-terminal interconnects (e.g., $308b_1$; $1408b_1$) and a second subset of MEOL second-terminal interconnects (e.g., $308b_2$; $1408b_2$). Note that other examples are possible, as the first plurality of MEOL interconnects could be at least two of $308b_1$, $308b_2$, $308b_3$, and $308b_4$, or at least two of $1408b_1$, $1408b_2$, $1408b_3$, and $1408b_4$. The device further includes a second plurality of MEOL interconnects (e.g., $308t_1$, $308t_2$; $1408t_1$, $1408t_2$) coupled to a first node (e.g., top terminal of the capacitor 370) and extending in the first direction across at least a portion of the device. The second plurality of MEOL interconnects (e.g., $308t_1$, $308t_2$; $1408t_1$, $1408t_2$) includes at least a first subset of MEOL first-terminal interconnects (e.g., $308t_1$; $1408t_1$) and a second subset of MEOL first-terminal interconnects (e.g., $308t_2$; $1408t_2$). Note that other examples are possible, as the second plurality of MEOL interconnects could be at least two of $308t_1$, $308t_2$, $308t_3$, and $308t_4$, or at least two of $1408t_1$, $1408t_2$, $1408t_3$, and $1408t_4$. The first plurality of MEOL interconnects (e.g., $308b_1$, $308b_2$; $1408b_1$, $1408b_2$) and the second plurality of MEOL interconnects (e.g., $308t_1$, $308t_2$; $1408t_1$, $1408t_2$) are interleaved. Specifically, the first subset of MEOL second-terminal interconnects (e.g., $308b_1$; $1408b_1$) and the first subset of MEOL first-terminal interconnects (e.g., $308t_1$; $1408t_1$) are interleaved and are a first subset of interleaved MEOL interconnects (e.g., $308b_1$, $308t_1$; $1408b_1$, $1408t_1$). In addition, the second subset of MEOL second-terminal interconnects (e.g., $308b_2$; $1408b_2$) and the second subset of MEOL first-terminal interconnects (e.g., $308t_2$; $1408t_2$) are interleaved and are a second subset of interleaved MEOL interconnects (e.g., $308b_2$, $308t_2$; $1408b_2$, $1408t_2$). The device further includes at least one of a first plurality of gate interconnects 302, 1402 (at 330, 332, 334; 1430, 1432, 1434) or a first plurality of OD regions 305, 1405 (at 330, 334; 1430, 1434) extending in a second direction between the first subset of interleaved MEOL interconnects (e.g., $308b_1$, $308t_1$; $1408b_1$, $1408t_1$) and the second subset of interleaved MEOL interconnects (e.g., $308b_2$, $308t_2$; $1408b_2$, $1408t_2$). The second direction is orthogonal to the first direction.

In one configuration, the first plurality of MEOL interconnects (e.g., $308b_1$, $308b_2$; $1408b_1$, $1408b_2$) is configured to be at least a portion of a second terminal (e.g., bottom terminal) of a capacitor 370, and the second plurality of MEOL interconnects (e.g., $308t_1$, $308t_2$; $1408t_1$, $1408t_2$) is configured to be at least a portion of a first terminal (e.g., top terminal) of the capacitor 370.

In one configuration, the device includes both the first plurality of OD regions 305, 1405 (at 330, 334; 1430, 1434) and the first plurality of gate interconnects 302, 1402 (at 330, 334; 1430, 1434) extending in the second direction between the first subset of interleaved MEOL interconnects (e.g., $308b_1$, $308t_1$; $1408b_1$, $1408t_1$) and the second subset of interleaved MEOL interconnects (e.g., $308b_2$, $308t_2$; $1408b_2$, $1408t_2$). The first plurality of gate interconnects 302, 1402 and the first plurality of OD regions 305, 1405 are interleaved. In one configuration, the first plurality of gate interconnects 302, 1402 and the first plurality of OD regions 305, 1405 may be floating.

In one configuration, the first plurality of MEOL interconnects (e.g., $308b_1$, $308b_2$, $308b_3$, $308b_4$; $1408b_1$, $1408b_2$, $1408b_3$, $1408b_4$) further includes a third subset of MEOL second-terminal interconnects (e.g., $308b_3$; $1408b_3$) and a fourth subset of MEOL second-terminal interconnects (e.g., $308b_4$; $1408b_4$). In addition, in such a configuration, the second plurality of MEOL interconnects (e.g., $308t_1$, $308t_2$, $308t_3$, $308t_4$; $1408t_1$, $1408t_2$, $1408t_3$, $1408t_4$) further includes a third subset of MEOL first-terminal interconnects (e.g., $308t_3$; $1408t_3$) and a fourth subset of MEOL first-terminal interconnects (e.g., $308t_4$; $1408t_4$). The third subset of MEOL second-terminal interconnects (e.g., $308b_3$; $1408b_3$) is interleaved with the third subset of MEOL first-terminal interconnects (e.g., $308t_3$; $1408t_3$). The fourth subset of MEOL second-terminal interconnects (e.g., $308b_4$;

$1408b_4$) is interleaved with the fourth subset of MEOL first-terminal interconnects (e.g., $308t_4$; $1408t_4$).

In one configuration, the third subset of MEOL second-terminal interconnects (e.g., $308b_3$; $1408b_3$) and the third subset of MEOL first-terminal interconnects (e.g., $308t_3$; $1408t_3$) are a third subset of interleaved MEOL interconnects (e.g., $308b_3$, $308t_3$; $1408b_3$, $1408t_3$), and the fourth subset of MEOL second-terminal interconnects (e.g., $308b_4$; $1408b_4$) and the fourth subset of MEOL first-terminal interconnects (e.g., $308t_4$; $1408t_4$) are a fourth subset of interleaved MEOL interconnects (e.g., $308b_4$, $308t_4$; $1408b_4$, $1408t_4$).

In one configuration, the device includes both the first plurality of OD regions 305, 1405 (e.g., at 330) and the first plurality of gate interconnects 302, 1402 (e.g., at 330) extending in the second direction between the first subset of interleaved MEOL interconnects (e.g., $308b_1$, $308t_1$; $1408b_1$, $1408t_1$) and the second subset of interleaved MEOL interconnects (e.g., $308b_2$, $308t_2$; $1408b_2$, $1408t_2$). The first plurality of gate interconnects 302, 1402 and the first plurality of OD regions 305, 1405 are interleaved. In such a configuration, the first plurality of gate interconnects 302, 1402 and the first plurality of OD regions 305, 1405 may be floating.

In one configuration, the device further includes a second plurality of gate interconnects 302, 1402 (e.g., at 332) extending in a second direction between the second subset of interleaved MEOL interconnects (e.g., $308b_2$, $308t_2$; $1408b_2$, $1408t_2$) and the third subset of interleaved MEOL interconnects (e.g., $308b_3$, $308t_3$; $1408b_3$, $1408t_3$). In such a configuration, the second plurality of gate interconnects 302, 1402 may be floating.

In one configuration, the device further includes a third plurality of gate interconnects 302, 1402 (e.g., at 334) extending in the second direction between the third subset of interleaved MEOL interconnects (e.g., $308b_3$, $308t_3$; $1408b_3$, $1408t_3$) and the fourth subset of interleaved MEOL interconnects (e.g., $308b_4$, $308t_4$; $1408b_4$, $1408t_4$). In addition, in such a configuration, the device further includes a second plurality of OD regions 305, 1405 (e.g., at 334) extending in the second direction between the third subset of interleaved MEOL interconnects (e.g., $308b_3$, $308t_3$; $1408b_3$, $1408t_3$) and the fourth subset of interleaved MEOL interconnects (e.g., $308b_4$, $308t_4$; $1408b_4$, $1408t_4$). The third plurality of gate interconnects 302, 1402 and the second plurality of OD regions 305, 1405 are interleaved. In such a configuration, the third plurality of gate interconnects 302, 1402 and the second plurality of OD regions 305, 1405 may be floating.

In one configuration, the device further includes an n-well 480, 780, 1180, 1580 extending across the device. The n-well 480, 780, 1180, 1580 is below the first plurality of MEOL interconnects (e.g., $308b_1$, $308b_2$, $308b_3$, $308b_4$; $1408b_1$, $1408b_2$, $1408b_3$, $1408b_4$) and the second plurality of MEOL interconnects (e.g., $308t_1$, $308t_2$, $308t_3$, $308t_4$; $1408t_1$, $1408t_2$, $1408t_3$, $1408t_4$). In a first configuration, the first plurality of MEOL interconnects (e.g., $308b_1$, $308b_2$, $308b_3$, $308b_4$; $1408b_1$, $1408b_2$, $1408b_3$, $1408b_4$) may be coupled to the n-well 480, 780, 1180, 1580. In a second configuration, a third node may be coupled to the n-well 480, 780, 1180, 1580, where the third node is unconnected to the first node (e.g., top terminal of the capacitor 370) and the second node (e.g., bottom terminal of the capacitor 370).

In one configuration, the device further includes a BEOL MOM capacitor 800, 1200 with a second terminal (e.g., bottom terminal of the capacitor 370) coupled to the second node and a first terminal (e.g., top terminal of the capacitor 370) coupled to the first node. As illustrated in FIGS. 9, 13, the lower portion of the capacitor 370 illustrated in FIGS. 5, 10 (i.e., MEOL capacitor) is coupled to the upper portion of the capacitor 370 illustrated in FIGS. 8, 12 (i.e., BEOL MOM capacitor). Note that the lower portion of the capacitor 370 (i.e., MEOL capacitor) illustrated in FIGS. 3, 4, 7, 11, 14-17 may also be coupled to an upper portion of the capacitor 370 (i.e., BEOL MOM capacitor; see FIGS. 8, 12).

In one configuration, as illustrated in FIGS. 3, 4, 16, 17, the device further includes a first set of vias $312b$, $1612b_1$ coupling the first plurality of MEOL interconnects (e.g., $308b_1$, $308b_2$, $308b_3$, $308b_4$; $1408b_1$, $1408b_2$, $1408b_3$, $1408b_4$) at a first side of the device to the second node, and includes a second set of vias $312t$, $1612t$ coupling the second plurality of MEOL interconnects (e.g., $308t_1$, $308t_2$, $308t_3$, $308t_4$; $1408t_1$, $1408t_2$, $1408t_3$, $1408t_4$) at a second side of the device to the first node.

In one configuration, as illustrated in FIGS. 14-17, the device further includes a third plurality of MEOL interconnects (e.g., $1408b_5$, $1408b6$) coupled to the second node and extending in the first direction across at least a portion of the device. The first plurality of MEOL interconnects (e.g., $1408b_1$, $1408b_2$) and the third plurality of MEOL interconnects are collinear (e.g., $1408b_5$, $1408b6$). Note that other examples are possible, as the first plurality of MEOL interconnects could be at least two of $1408b_1$, $1408b_2$, $1408b_3$, and $1408b_4$, and the third plurality of MEOL interconnects could be at least two of the corresponding sets of MEOL interconnects $1408b_5$, $1408b_6$, $1408b_7$, and $1408b_8$. In addition, the device further includes a fourth plurality of MEOL interconnects (e.g., $1408t_5$, $1408t6$) coupled to the first node and extending in the first direction across at least a portion of the device. The third plurality of MEOL interconnects (e.g., $1408b_5$, $1408b6$) and the fourth plurality of MEOL interconnects (e.g., $1408t_5$, $1408t6$) are interleaved. Note that other examples are possible, as the third plurality of MEOL interconnects could be at least two of $1408b_5$, $1408b_6$, $1408b_7$, and $1408b_8$, and the fourth plurality of MEOL interconnects could be at least two of the corresponding sets of MEOL interconnects $1408t_5$, $1408t_6$, $1408t_7$, and $1408t_8$.

In one configuration, as illustrated in FIGS. 16, 17, the device further includes a first set of vias $1612b_1$ coupling the first plurality of MEOL interconnects (e.g., $1408b_1$, $1408b_2$, $1408b_3$, $1408b_4$) at a first side of the device to the second node, a second set of vias $1612t$ coupling the second plurality of MEOL interconnects (e.g., $1408t_1$, $1408t_2$, $1408t_3$, $1408t_4$) and the fourth plurality of MEOL interconnects (e.g., $1408t_5$, $1408t_6$, $1408t_7$, $1408t_8$) to the first node, and a third set of vias $1612b_2$ coupling the third plurality of MEOL interconnects (e.g., $1408b_5$, $1408b_6$, $1408b_7$, $1408b_8$) at a second side of the device to the second node. The second set of vias $1612t$ may be approximately in a center of the device.

In one configuration, as illustrated in FIGS. 5, 7, 10, 11, 14, 15, the device further includes a first interconnect $310b$, $1410b_1$ extending in the second direction across the device and adjacent a first side of the device. The first interconnect $310b$, $1410b_1$ is coupled to the first plurality of MEOL interconnects (e.g., $308b_1$, $308b_2$, $308b_3$, $308b_4$; $1408b_1$, $1408b_2$, $1408b_3$, $1408b_4$) and to the second node. In addition, the device further includes a second interconnect $310t$, $1410t$ extending in the second direction across the device. The second interconnect $310t$, $1410t$ is coupled to the second plurality of MEOL interconnects (e.g., $308t_1$, $308t_2$, $308t_3$, $308t_4$; $1408t_1$, $1408t_2$, $1408t_3$, $1408t_4$) and to the first node.

In one configuration, the first plurality of MEOL interconnects (e.g., $308b_1$, $308b_2$, $308b_3$, $308b_4$; $1408b_1$, $1408b_2$, $1408b_3$, $1408b_4$) extend as fingers from the first interconnect $310b$, $1410b_1$ in the first direction towards the second interconnect $310t$, $1410t$, and the second plurality of MEOL interconnects (e.g., $308t_1$, $308t_2$, $308t_3$, $308t_4$; $1408t_1$, $1408t_2$, $1408t_3$, $1408t_4$) extend as fingers from the second interconnect $310t$, $1410t$ in the first direction towards the first interconnect $310b$, $1410b_1$.

In one configuration, each of the first interconnect $310b$, $1410b_1$ and the second interconnect $310t$, $1410t$ is a first type of interconnect (e.g., type A MEOL interconnect), and each interconnect of the first plurality of MEOL interconnects (e.g., $308b_1$, $308b_2$, $308b_3$, $308b_4$; $1408b_1$, $1408b_2$, $1408b_3$, $1408b_4$) and the second plurality of MEOL interconnects (e.g., $308t_1$, $308t_2$, $308t_3$, $308t_4$; $1408t_1$, $1408t_2$, $1408t_3$, $1408t_4$) is a second type of interconnect (e.g., type B MEOL interconnect).

In one configuration, each of the first interconnect $310b$, $1410b_1$ and the second interconnect $310t$, $1410t$ has a first thickness $t_A$ in a third direction orthogonal to the first direction and the second direction, and each interconnect of the first plurality of MEOL interconnects (e.g., $308b_1$, $308b_2$, $308b_3$, $308b_4$; $1408b_1$, $1408b_2$, $1408b_3$, $1408b_4$) and the second plurality of MEOL interconnects (e.g., $308t_1$, $308t_2$, $308t_3$, $308t_4$; $1408t_1$, $1408t_2$, $1408t_3$, $1408t_4$) has a second thickness $t_B$ in the third direction, where the second thickness $t_B$ is greater than the first thickness $t_A$.

In one configuration, the first interconnect $310b$, $1410b_1$ and the first plurality of MEOL interconnects (e.g., $308b_1$, $308b_2$, $308b_3$, $308b_4$; $1408b_1$, $1408b_2$, $1408b_3$, $1408b_4$) couple together on a same layer, and the second interconnect $310t$, $1410t$ and the second plurality of MEOL interconnects (e.g., $308t_1$, $308t_2$, $308t_3$, $308t_4$; $1408t_1$, $1408t_2$, $1408t_3$, $1408t_4$) couple together on a same layer. In one configuration, the first interconnect $310b$, $1410b_1$ and the second interconnect $310t$, $1410t$ are MEOL interconnects.

In one configuration, as illustrated in FIGS. 5, 7, 10, 11, the second interconnect $310t$ is approximately adjacent a second side of the device, where the second side is opposite the first side in the first direction. In one configuration, as illustrated in FIGS. 10, 11, the device further includes a third interconnect $1010b$ extending in the second direction across the device. The third interconnect $1010b$ is adjacent the second side of the device. The third interconnect $1010b$ is coupled to the first interconnect $310b$. In one configuration, as illustrated in FIGS. 12, 13, the device further includes a BEOL interconnect $1240b$ on a third side of the device. The BEOL interconnect $1240b$ couples the first interconnect $310b$ and the third interconnect $1010b$ together. In one configuration, the third interconnect $1010b$ is a MEOL interconnect (e.g., type B MEOL interconnect).

In one configuration, as illustrated in FIGS. 14, 15, the second interconnect $1410t$ is approximately in a middle of the device. In such a configuration, the device further includes a third interconnect $1410b_2$ extending in the second direction across the device and adjacent a second side of the device. The second side is opposite the first side in the first direction. In addition, the device includes a third plurality of MEOL interconnects (e.g., $1408b_5$, $1408b_6$, $1408b_7$, $1408b_8$) contacting the third interconnect $1410b_2$ and extending as fingers from the third interconnect $1410b_2$ in the first direction towards the second interconnect $1410t$. Further, the device includes a fourth plurality of MEOL interconnects (e.g., $1408t_5$, $1408t_6$, $1408t_7$, $1408t_8$) contacting the second interconnect $1410t$ and extending as fingers from the second interconnect $1410t$ in the first direction towards the third interconnect $1410b_2$. The third plurality of MEOL interconnects (e.g., $1408b_5$, $1408b_6$, $1408b_7$, $1408b_8$) and the fourth plurality of MEOL interconnects (e.g., $1408t_5$, $1408t_6$, $1408t_7$, $1408t_8$) are interleaved. In one configuration, the first interconnect $1410b_1$, the first plurality of MEOL interconnects (e.g., $1408b_1$, $1408b_2$, $1408b_3$, $1408b_4$), the third interconnect $1410b_2$, and the third plurality of MEOL interconnects (e.g., $1408b_5$, $1408b_6$, $1408b_7$, $1408b_8$) are configured to be at least a portion of a second terminal of a capacitor, and the second interconnect $1410t$, the second plurality of MEOL interconnects (e.g., $1408t_1$, $1408t_2$, $1408t_3$, $1408t_4$), and the fourth plurality of MEOL interconnects (e.g., $1408t_5$, $1408t_6$, $1408t_7$, $1408t_8$) are configured to be at least a portion of a first terminal of the capacitor. In one configuration, the third interconnect $1410b_2$ is a MEOL interconnect.

In one configuration, as illustrated in FIGS. 1, 2, 6, each gate interconnect of the first plurality of gate interconnects has a height in a third direction from a bulk substrate of $h_{B1}$, and each MEOL interconnect 108, 110, 208, 210, 308, 310, 1408, 1410 of the first plurality of MEOL interconnects (e.g., $308b_1$, $308b_2$, $308b_3$, $308b_4$; $1408b_1$, $1408b_2$, $1408b_3$, $1408b_4$) and the second plurality of MEOL interconnects (e.g., $308t_1$, $308t_2$, $308t_3$, $308t_4$; $1408t_1$, $1408t_2$, $1408t_3$, $1408t_4$) has a height in the third direction from the bulk substrate of h. The third direction is orthogonal to the first direction and the second direction. A thickness in the third direction of each MEOL interconnect 108, 110, 208, 210, 308, 310, 1408, 1410 of the first plurality of MEOL interconnects (e.g., $308b_1$, $308b_2$, $308b_3$, $308b_4$; $1408b_1$, $1408b_2$, $1408b_3$, $1408b_4$) and the second plurality of MEOL interconnects (e.g., $308t_1$, $308t_2$, $308t_3$, $308t_4$; $1408t_1$, $1408t_2$, $1408t_3$, $1408t_4$) is equal to $h-h_{B1}$.

Referring again to FIGS. 3-17, different configurations of capacitors are provided that have a higher density than existing MOM capacitors. The provided capacitors have top and bottom terminals, where a portion of the top and bottom terminals are on MEOL layers and MEOL interconnects of the top and bottom terminals are interleaved. Specifically, the interleaved MEOL interconnects may be type B MEOL interconnects. The interleaved type B MEOL interconnects may be referred to as a MEOL capacitor. In some configurations, as illustrated in FIGS. 3, 4, 16, 17, the interleaved type B MEOL interconnects are coupled to a BEOL MOM capacitor through vias, and in other configurations, as illustrated in FIGS. 5, 7, 10, 11, 14, 15, the interleaved type B MEOL interconnects are coupled together with type A MEOL interconnects, and the type A MEOL interconnects are coupled to a BEOL MOM capacitor. The MEOL capacitor and the BEOL MOM capacitor are coupled together in parallel and operate as one capacitor. The provided capacitor provides a 44% increase in density due to the MEOL capacitor. In some configurations, as illustrated in FIGS. 5, 7, 10, 11, 14, 15, the bottom terminal may shield the top terminal in order to reduce parasitic capacitances on the top terminal. In some configurations, as illustrated in FIGS. 14, 15, the top terminal is shielded by the bottom terminal and the Q-factor is increased compared to other configurations. In some configurations, as illustrated in FIGS. 7, 11, 15, 17, the device may include an n-well, which when tied to the bottom terminal, may further reduce a parasitic capacitance on the top terminal at the expense of increasing the parasitic capacitance on the bottom terminal. As discussed above, tying the bottom-terminal interleaved MEOL interconnects to the n-well reduces the top terminal parasitic capacitance to total capacitance ratio from 4% to 0.6%, but at the expense of increasing the non-linearity of the capacitor and increasing the bottom terminal parasitic capacitance to total capacitance ratio from 4.5% to 20%-22%.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The following examples are illustrative only and may be combined with aspects of other implementations or teachings described herein, without limitation.

Aspect 1 is a device includes a first plurality of middle-end-of-line (MEOL) interconnects coupled to a second node and extending in a first direction across at least a portion of the device. The first plurality of MEOL interconnects includes at least a first subset of MEOL second-terminal interconnects and a second subset of MEOL second-terminal interconnects. The device further includes a second plurality of MEOL interconnects coupled to a first node and extending in the first direction across at least a portion of the device. The second plurality of MEOL interconnects includes at least a first subset of MEOL first-terminal interconnects and a second subset of MEOL first-terminal interconnects. The first subset of MEOL second-terminal interconnects and the first subset of MEOL first-terminal interconnects are interleaved and are a first subset of interleaved MEOL interconnects. The second subset of MEOL second-terminal interconnects and the second subset of MEOL first-terminal interconnects are interleaved and are a second subset of interleaved MEOL interconnects. The device further includes at least one of a first plurality of gate interconnects or a first plurality of oxide diffusion (OD) regions extending in a second direction between the first subset of interleaved MEOL interconnects and the second subset of interleaved MEOL interconnects. The second direction is orthogonal to the first direction.

Aspect 2 is the device of aspect 1, wherein the first plurality of MEOL interconnects is configured to be at least a portion of a second terminal of a capacitor, and the second plurality of MEOL interconnects is configured to be at least a portion of a first terminal of the capacitor.

Aspect 3 is the device of any of aspect 1 and 2, wherein the at least one of the first plurality of gate interconnects or the first plurality of OD regions comprises both the first plurality of gate interconnects and the first plurality of OD regions, the first plurality of gate interconnects and the first plurality of OD regions being interleaved.

Aspect 4 is the device of aspect 3, wherein the first plurality of gate interconnects and the first plurality of OD regions are floating.

Aspect 5 is the device of any of aspects 1 to 4, wherein: the first plurality of MEOL interconnects further comprises a third subset of MEOL second-terminal interconnects and a fourth subset of MEOL second-terminal interconnects; the second plurality of MEOL interconnects further comprises a third subset of MEOL first-terminal interconnects and a fourth subset of MEOL first-terminal interconnects; the third subset of MEOL second-terminal interconnects is interleaved with the third subset of MEOL first-terminal interconnects; and the fourth subset of MEOL second-terminal interconnects is interleaved with the fourth subset of MEOL first-terminal interconnects.

Aspect 6 is the device of aspect 5, wherein the third subset of MEOL second-terminal interconnects and the third subset of MEOL first-terminal interconnects are a third subset of interleaved MEOL interconnects, and the fourth subset of MEOL second-terminal interconnects and the fourth subset of MEOL first-terminal interconnects are a fourth subset of interleaved MEOL interconnects.

Aspect 7 is the device of aspect 6, wherein the at least one of the first plurality of gate interconnects or the first plurality of OD regions comprises both the first plurality of gate interconnects and the first plurality of OD regions, the first plurality of gate interconnects and the first plurality of OD regions being interleaved, and wherein the first plurality of gate interconnects and the first plurality of OD regions are floating.

Aspect 8 is the device of aspect 7, further comprising a second plurality of gate interconnects extending in a second direction between the second subset of interleaved MEOL interconnects and the third subset of interleaved MEOL interconnects, wherein the second plurality of gate interconnects are floating.

Aspect 9 is the device of aspect 8, further comprising: a third plurality of gate interconnects extending in the second direction between the third subset of interleaved MEOL interconnects and the fourth subset of interleaved MEOL interconnects; and a second plurality of OD regions extending in the second direction between the third subset of interleaved MEOL interconnects and the fourth subset of interleaved MEOL interconnects, the third plurality of gate interconnects and the second plurality of OD regions being interleaved, wherein the third plurality of gate interconnects and the second plurality of OD regions are floating.

Aspect 10 is the device of any of aspects 1 to 9, further comprising an n-well extending across the device, the n-well being below the first plurality of MEOL interconnects and the second plurality of MEOL interconnects.

Aspect 11 is the device of aspect 10, wherein the first plurality of MEOL interconnects is coupled to the n-well.

Aspect 12 is the device of aspect 10, wherein a third node is coupled to the n-well, the third node being unconnected to the first node and the second node.

Aspect 13 is the device of any of aspects 1 to 12, further comprising a back-end-of-line (BEOL) metal-oxide-metal (MOM) capacitor with a second terminal coupled to the second node and a first terminal coupled to the first node.

Aspect 14 is the device of any of aspects 1 to 13, further comprising: a first set of vias coupling the first plurality of MEOL interconnects at a first side of the device to the second node; and a second set of vias coupling the second plurality of MEOL interconnects at a second side of the device to the first node.

Aspect 15 is the device of any of aspects 1 to 14, further comprising: a third plurality of MEOL interconnects coupled to the second node and extending in the first direction across at least a portion of the device, the first plurality of MEOL interconnects and the third plurality of MEOL interconnects being collinear; and a fourth plurality of MEOL interconnects coupled to the first node and extending in the first direction across at least a portion of the device, wherein the third plurality of MEOL interconnects and the fourth plurality of MEOL interconnects are interleaved.

Aspect 16 is the device of aspect 15, further comprising: a first set of vias coupling the first plurality of MEOL interconnects at a first side of the device to the second node; a second set of vias coupling the second plurality of MEOL interconnects and the fourth plurality of MEOL interconnects to the first node; and a third set of vias coupling the third plurality of MEOL interconnects at a second side of the device to the second node.

Aspect 17 is the device of aspect 16, wherein the second set of vias is approximately in a center of the device.

Aspect 18 is the device of any of aspects 1 to 13, and 15, further comprising: a first interconnect extending in the second direction across the device and adjacent a first side of the device, the first interconnect being coupled to the first plurality of MEOL interconnects and to the second node; and a second interconnect extending in the second direction across the device, the second interconnect being coupled to the second plurality of MEOL interconnects and to the first node.

Aspect 19 is the device of aspect 18, wherein the first plurality of MEOL interconnects extend as fingers from the first interconnect in the first direction towards the second interconnect, and the second plurality of MEOL interconnects extend as fingers from the second interconnect in the first direction towards the first interconnect.

Aspect 20 is the device of any of aspects 18 and 19, wherein each of the first interconnect and the second interconnect is a first type of interconnect, and each interconnect of the first plurality of MEOL interconnects and the second plurality of MEOL interconnects is a second type of interconnect.

Aspect 21 is the device of aspect 20, wherein each of the first interconnect and the second interconnect has a first thickness in a third direction orthogonal to the first direction and the second direction, and each interconnect of the first plurality of MEOL interconnects and the second plurality of MEOL interconnects has a second thickness in the third direction, the second thickness being greater than the first thickness.

Aspect 22 is the device of any of aspects 18 to 21, wherein the first interconnect and the first plurality of MEOL interconnects couple together on a same layer, and the second interconnect and the second plurality of MEOL interconnects couple together on a same layer.

Aspect 23 is the device of any of aspects 18 to 22, wherein the first interconnect and the second interconnect are MEOL interconnects.

Aspect 24 is the device of any of aspects 18 to 23, the second interconnect is approximately adjacent a second side of the device, the second side being opposite the first side in the first direction.

Aspect 25 is the device of aspect 24, further comprising a third interconnect extending in the second direction across the device, the third interconnect being adjacent the second side of the device, the third interconnect being coupled to the first interconnect.

Aspect 26 is the device of aspect 25, further comprising a BEOL interconnect on a third side of the device, the BEOL interconnect coupling the first interconnect and the third interconnect together.

Aspect 27 is the device of any of aspects 25 and 26, wherein the third interconnect is a MEOL interconnect.

Aspect 28 is the device of any of aspect 18 to 23, wherein the second interconnect is approximately in a middle of the device, the device further comprising: a third interconnect extending in the second direction across the device and adjacent a second side of the device, the second side being opposite the first side in the first direction; a third plurality of MEOL interconnects contacting the third interconnect and extending as fingers from the third interconnect in the first direction towards the second interconnect; and a fourth plurality of MEOL interconnects contacting the second interconnect and extending as fingers from the second interconnect in the first direction towards the third interconnect, wherein the third plurality of MEOL interconnects and the fourth plurality of MEOL interconnects are interleaved.

Aspect 29 is the device of aspect 28, wherein the first interconnect, the first plurality of MEOL interconnects, the third interconnect, and the third plurality of MEOL interconnects are configured to be at least a portion of a second terminal of a capacitor, and wherein the second interconnect, the second plurality of MEOL interconnects, and the fourth plurality of MEOL interconnects are configured to be at least a portion of a first terminal of the capacitor.

Aspect 30 is the device of any of aspects 28 and 29, wherein the third interconnect is a MEOL interconnect.

Aspect 31 is the device of any of aspects 1 to 30, wherein each gate interconnect of the first plurality of gate interconnects has a height in a third direction from a bulk substrate of $h_{B1}$, and each MEOL interconnect of the first plurality of MEOL interconnects and the second plurality of MEOL interconnects has a height in the third direction from the bulk substrate of h, the third direction being orthogonal to the first direction and the second direction, and wherein a thickness in the third direction of each MEOL interconnect of the first plurality of MEOL interconnects and the second plurality of MEOL interconnects is equal to $h-h_{B1}$.

What is claimed is:
1. A device, comprising:
a first plurality of middle-end-of-line (MEOL) interconnects coupled to a second node and having a length extending from the second node towards a portion adjacent a first node in a first direction across at least a portion of the device, the first plurality of MEOL interconnects including at least a first subset of MEOL second-terminal interconnects and a second subset of MEOL second-terminal interconnects;

a second plurality of MEOL interconnects coupled to the first node and having a length extending from the first node towards a portion adjacent the second node extending in the first direction across at least a portion of the device, the second plurality of MEOL interconnects including at least a first subset of MEOL first-terminal interconnects and a second subset of MEOL first-terminal interconnects, the first subset of MEOL second-terminal interconnects and the first subset of MEOL first-terminal interconnects being interleaved and being a first subset of interleaved MEOL interconnects, the second subset of MEOL second-terminal interconnects and the second subset of MEOL first-terminal interconnects being interleaved and being a second subset of interleaved MEOL interconnects; and a first plurality of unconnected and floating gate interconnects and a first plurality of unconnected and floating oxide diffusion (OD) regions extending in a second direction and each arranged to be separated from one another along the first direction between the first subset of interleaved MEOL interconnects and the second subset of interleaved MEOL interconnects, the second direction being orthogonal to the first direction.

2. The device of claim 1, wherein the first plurality of MEOL interconnects is configured to be at least a portion of a second terminal of a capacitor, and the second plurality of MEOL interconnects is configured to be at least a portion of a first terminal of the capacitor.

3. The device of claim 1, wherein the first plurality of gate interconnects and the first plurality of OD regions are interleaved.

4. The device of claim 1, wherein:
the first plurality of MEOL interconnects further comprises a third subset of MEOL second-terminal interconnects and a fourth subset of MEOL second-terminal interconnects;
the second plurality of MEOL interconnects further comprises a third subset of MEOL first-terminal interconnects and a fourth subset of MEOL first-terminal interconnects;
the third subset of MEOL second-terminal interconnects is interleaved with the third subset of MEOL first-terminal interconnects; and
the fourth subset of MEOL second-terminal interconnects is interleaved with the fourth subset of MEOL first-terminal interconnects.

5. The device of claim 4, wherein the third subset of MEOL second-terminal interconnects and the third subset of MEOL first-terminal interconnects are a third subset of interleaved MEOL interconnects, and the fourth subset of MEOL second-terminal interconnects and the fourth subset of MEOL first-terminal interconnects are a fourth subset of interleaved MEOL interconnects.

6. The device of claim 5, wherein the first plurality of gate interconnects and the first plurality of OD regions are interleaved.

7. The device of claim 6, further comprising a second plurality of gate interconnects extending in a second direction between the second subset of interleaved MEOL interconnects and the third subset of interleaved MEOL interconnects, wherein the second plurality of gate interconnects are floating.

8. The device of claim 7, further comprising:
a third plurality of gate interconnects extending in the second direction between the third subset of interleaved MEOL interconnects and the fourth subset of interleaved MEOL interconnects; and
a second plurality of OD regions extending in the second direction between the third subset of interleaved MEOL interconnects and the fourth subset of interleaved MEOL interconnects, the third plurality of gate interconnects and the second plurality of OD regions being interleaved,
wherein the third plurality of gate interconnects and the second plurality of OD regions are floating.

9. The device of claim 1, further comprising an n-type well (n-well) extending across the device, the n-well being below the first plurality of MEOL interconnects and the second plurality of MEOL interconnects.

10. The device of claim 9, wherein the first plurality of MEOL interconnects is coupled to the n-well.

11. The device of claim 9, wherein a third node is coupled to the n-well, the third node being unconnected to the first node and the second node.

12. The device of claim 1, further comprising a back-end-of-line (BEOL) metal-oxide-metal (MOM) capacitor with a second terminal coupled to the second node and a first terminal coupled to the first node.

13. The device of claim 1, further comprising:
a first set of vias coupling the first plurality of MEOL interconnects at a first side of the device to the second node; and
a second set of vias coupling the second plurality of MEOL interconnects at a second side of the device to the first node.

14. The device of claim 1, further comprising:
a third plurality of MEOL interconnects coupled to the second node and extending in the first direction across at least a portion of the device, the first plurality of MEOL interconnects and the third plurality of MEOL interconnects being collinear; and
a fourth plurality of MEOL interconnects coupled to the first node and extending in the first direction across at least a portion of the device,
wherein the third plurality of MEOL interconnects and the fourth plurality of MEOL interconnects are interleaved.

15. The device of claim 14, further comprising:
a first set of vias coupling the first plurality of MEOL interconnects at a first side of the device to the second node;
a second set of vias coupling the second plurality of MEOL interconnects and the fourth plurality of MEOL interconnects to the first node; and
a third set of vias coupling the third plurality of MEOL interconnects at a second side of the device to the second node.

16. The device of claim 15, wherein the second set of vias is in a center of the device in the second direction.

17. The device of claim 1, further comprising:
a first interconnect extending in the second direction across the device and adjacent a first side of the device, the first interconnect being coupled to the first plurality of MEOL interconnects and to the second node; and
a second interconnect extending in the second direction across the device, the second interconnect being coupled to the second plurality of MEOL interconnects and to the first node.

18. The device of claim 17, wherein the first plurality of MEOL interconnects extend as fingers from the first interconnect in the first direction towards the second interconnect, and the second plurality of MEOL interconnects extend as fingers from the second interconnect in the first direction towards the first interconnect.

19. The device of claim 17, wherein each of the first interconnect and the second interconnect is a first type of interconnect, and each interconnect of the first plurality of MEOL interconnects and the second plurality of MEOL interconnects is a second type of interconnect.

20. The device of claim 19, wherein each of the first interconnect and the second interconnect has a first thickness in a third direction orthogonal to the first direction and the second direction, and each interconnect of the first plurality of MEOL interconnects and the second plurality of MEOL interconnects has a second thickness in the third direction, the second thickness being greater than the first thickness.

21. The device of claim 17, wherein the first interconnect and the first plurality of MEOL interconnects couple together on a same layer, and the second interconnect and the second plurality of MEOL interconnects couple together on a same layer.

22. The device of claim 17, wherein the first interconnect and the second interconnect are MEOL interconnects.

23. The device of claim 17, wherein the second interconnect is approximately adjacent a second side of the device, the second side being opposite the first side in the first direction.

24. The device of claim 23, further comprising a third interconnect extending in the second direction across the device, the third interconnect being adjacent the second side of the device, the third interconnect being coupled to the first interconnect.

25. The device of claim 24, further comprising a back-end-of-line (BEOL) interconnect on a third side of the device, the BEOL interconnect coupling the first interconnect and the third interconnect together.

26. The device of claim 24, wherein the third interconnect is a MEOL interconnect.

27. The device of claim 17, wherein the second interconnect is approximately in a middle of the device, the device further comprising:

a third interconnect extending in the second direction across the device and adjacent a second side of the device, the second side being opposite the first side in the first direction;

a third plurality of MEOL interconnects contacting the third interconnect and extending as fingers from the third interconnect in the first direction towards the second interconnect; and a fourth plurality of MEOL interconnects contacting the second interconnect and extending as fingers from the second interconnect in the first direction towards the third interconnect, wherein the third plurality of MEOL interconnects and the fourth plurality of MEOL interconnects are interleaved.

28. The device of claim 27, wherein the first interconnect, the first plurality of MEOL interconnects, the third interconnect, and the third plurality of MEOL interconnects are configured to be at least a portion of a second terminal of a capacitor, and wherein the second interconnect, the second plurality of MEOL interconnects, and the fourth plurality of MEOL interconnects are configured to be at least a portion of a first terminal of the capacitor.

29. The device of claim 27, wherein the third interconnect is a MEOL interconnect.

30. The device of claim 1, wherein each gate interconnect of the first plurality of gate interconnects has a height in a third direction from a bulk substrate of $h_{B1}$, and each MEOL interconnect of the first plurality of MEOL interconnects and the second plurality of MEOL interconnects has a height in the third direction from the bulk substrate of h, the third direction being orthogonal to the first direction and the second direction, and wherein a thickness in the third direction of each MEOL interconnect of the first plurality of MEOL interconnects and the second plurality of MEOL interconnects is equal to $h-h_{B1}$.

* * * * *